United States Patent
Kawamura et al.

(10) Patent No.: US 9,111,618 B2
(45) Date of Patent: Aug. 18, 2015

(54) DE-DUPLICATION IN FLASH MEMORY MODULE

(71) Applicant: Hitachi, Ltd., Tokyo (JP)

(72) Inventors: Atsushi Kawamura, Yokohama (JP); Junji Ogawa, Sagamihara (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/329,171

(22) Filed: Jul. 11, 2014

(65) Prior Publication Data

US 2014/0321208 A1   Oct. 30, 2014

Related U.S. Application Data

(63) Continuation of application No. 13/729,879, filed on Dec. 28, 2012, now Pat. No. 8,799,562, which is a continuation of application No. 12/992,028, filed as application No. PCT/JP2010/006310 on Oct. 26, 2010, now Pat. No. 8,352,676.

(51) Int. Cl.
| | |
|---|---|
| *G11C 16/04* | (2006.01) |
| *G06F 12/02* | (2006.01) |
| *G06F 3/06* | (2006.01) |
| *G06F 11/10* | (2006.01) |

(52) U.S. Cl.
CPC .......... *G11C 16/0483* (2013.01); *G06F 3/0608* (2013.01); *G06F 3/0616* (2013.01); *G06F 3/0641* (2013.01); *G06F 3/0688* (2013.01); *G06F 11/108* (2013.01); *G06F 11/1044* (2013.01); *G06F 12/0246* (2013.01); *G11C 16/04* (2013.01); *G06F 2212/7202* (2013.01)

(58) Field of Classification Search
CPC ..................... G06F 12/0246; G06F 2212/7202
USPC .......................................... 711/103
See application file for complete search history.

(56) References Cited

U.S. PATENT DOCUMENTS

| | | | |
|---|---|---|---|
| 2007/0124533 A1 | 5/2007 | Estakhri et al. | |
| 2009/0089483 A1 | 4/2009 | Tanaka et al. | |
| 2010/0023682 A1 | 1/2010 | Lee et al. | |
| 2010/0161608 A1 | 6/2010 | Jain et al. | |

FOREIGN PATENT DOCUMENTS

| | | |
|---|---|---|
| EP | 2042980 A2 | 4/2009 |
| JP | 2009-087021 A | 4/2009 |
| JP | 2012-513069 A | 6/2012 |

*Primary Examiner* — Kalpit Parikh

(74) *Attorney, Agent, or Firm* — Volpe and Koenig, P.C.

(57) ABSTRACT

Data capacity efficiency is improved by de-duplicating data assigned with a code that is different for each data. A flash memory module includes a plurality of flash memory chips and a memory controller. Each flash memory chip includes a plurality of blocks, each block including a plurality of physical pages, each physical page being a unit for writing/reading data. The memory controller is configured to manage a first set and a second set of user data and a guarantee code associated with the user data. If the first set and the second set of user data are the same, then the same data sets are stored in a first physical page and the first and second guarantee codes are stored in a second physical page.

16 Claims, 17 Drawing Sheets

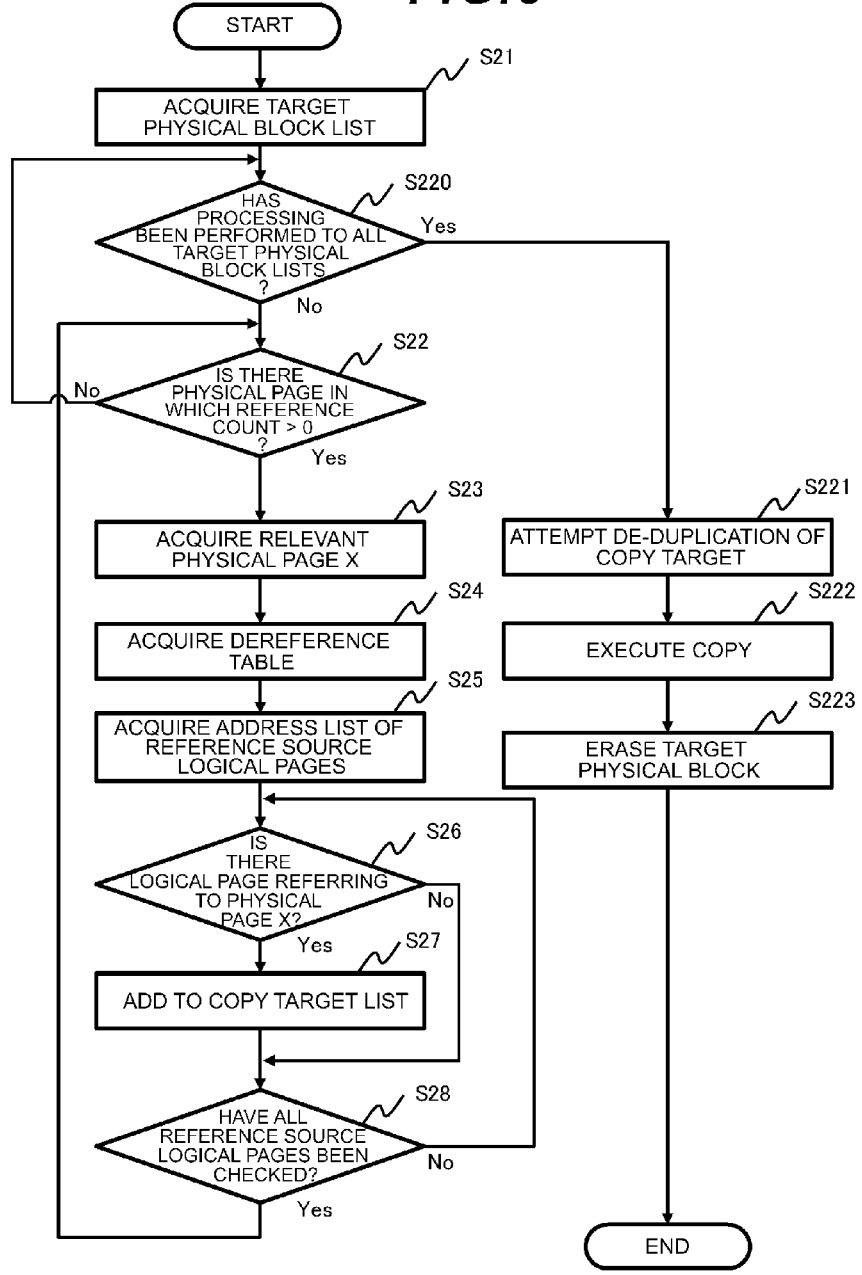

DE-DUPLICATION IN FLASH MEMORY MODULE

CROSS REFERENCE TO RELATED APPLICATIONS

This application is a continuation of U.S. patent application Ser. No. 13/729,879, filed on Dec. 28, 2012 which is a continuation of U.S. patent application Ser. No. 12/992,028, filed on Nov. 10, 2010, which issued as U.S. Pat. No. 8,352,676, which claims the benefit of PCT/JP2010/006310 filed on Oct. 26, 2010, which is incorporated by reference as if fully set forth.

TECHNICAL FIELD

The present invention relates to a storage apparatus and a data control method, and in particular can be suitably applied to a storage apparatus and a data control method that uses a device, in which rewriting is limited, as the storage medium.

BACKGROUND ART

Conventionally, in a storage apparatus, a non-volatile storage medium capable of random access; for example, a magnetic disk or an optical disk, has been used as the data storage medium. Particularly in recent years, a storage apparatus comprising numerous compact disk drives is becoming mainstream.

Moreover, pursuant to the advancement of semiconductor technology in recent years, a non-volatile semiconductor memory capable of bulk erasing has been developed. As an example of this type of non-volatile semiconductor memory, there is a flash memory. A storage apparatus that uses a flash memory as its storage medium is considered to be superior in terms of power saving and faster access time in comparison to a storage apparatus comprising numerous compact disk drives.

The foregoing flash memory is characterized in that data cannot be directly rewritten into a previously recorded data area. Thus, upon rewriting recorded data, after reading the recorded data, it is necessary to erase the recording area, and perform write processing of writing update data into the erased unwritten area. Nevertheless, since the erase time of a flash memory is longer than its write time, generally speaking, a method is adopted where, upon writing data, old data is once read and thereafter combined with the write data to create update data, the created update data is written into a separate unwritten area, and invalidating the original recording area (processing which disables the referral from a host system). If the unwritten area is depleted, the invalided area is erased to create a new unwritten area.

Nevertheless, with a flash memory, there is a limit in the number of times that the data can be erased. Thus, with a data area in which the rewriting of data is concentrated and erase count has increase, data can no longer be erased and it will become unusable. Thus, it was necessary to make sure that the data erase processing is not concentrated on a specific data area. Moreover, with a flash memory, since a page that is once written will also entail an increased read error rate with the lapse of time, an operation referred to as "refresh" of writing a page in which a given period of time has elapsed from the writing thereof to a separate page is required.

With a flash memory having the foregoing characteristics, de-duplication technology of shortening the data erase time or reducing the erase count is being used (for example, PTL 1). De-duplication technology is technology of associating, in cases where a logical address provided by a host system and a physical address of the actual storage area are associated and managed, a plurality of logical address spaces storing the same data with one physical address space storing such data. As a result of using the de-duplication technology, it is possible to reduce the amount of data that is written, and prolong the life and improve the performance stability of a flash memory in a storage apparatus that uses a flash memory as its storage medium.

CITATION LIST

Patent Literature

PTL 1 Japanese Unexamined Patent Application Publication No. 2009-87021

SUMMARY OF INVENTION

Technical Problem

Meanwhile, with a storage apparatus, in order to prevent bit errors of data stored in a data area caused by hardware failure or the like and the writing and reading to and from an unauthorized address due to an internal control error or the like, a guarantee code is assigned to the write data. Generally speaking, a guarantee code is a combination of a part that is calculated from the data content for the purpose of achieving data redundancy, and a part in which a value can be freely set for each vendor. If de-duplication is performed to data that is assigned with such a guarantee code, since the guarantee code portion will differ for each data, there is a problem in that de-duplication cannot be performed even if the data contents are the same since due to the difference in the guarantee code.

The present invention was devised in view of the foregoing points, and proposes a storage apparatus and a data control method capable of improving the data capacity efficiency by de-duplicating data assigned with a guarantee code that is different for each data.

Solution to Problem

In order to achieve the foregoing object, the present invention provides a storage apparatus comprising a flash memory control device equipped with one or more flash memory modules, wherein the flash memory module comprises at least one flash memory chip for providing a storage area, and a controller for controlling writing/reading of data including user data and a guarantee code accompanying the user data to and from the storage area provided by the flash memory chip, wherein the controller respectively divides a plurality of the data having the common user data into the user data and the guarantee code, stores one of the user data in an area of a predetermined unit of the storage area, and links and stores each of the guarantee codes accompanying the plurality of user data in an area of a predetermined unit of the storage area.

According to the foregoing configuration, among the plurality of data which are written into a flash memory chip, the plurality of data having common user data are divided into user data and a guarantee code, one user data is stored in a physical page, and the guarantee codes corresponding to the plurality of user data are linked and stored in a physical page. It is thereby possible to perform de-duplication even to data assigned with a guarantee code, and prolong the life of the flash memory as a result of reducing the amount of data that is written in the storage medium. In addition, in a storage medium such as a flash memory adopting the recordable writing method, it is possible to improve the performance stability by increasing the unused area that is not being used by the user and using such unused area as an area for recording data.

Advantageous Effects of Invention

According to the present invention, it is possible to improve the data capacity efficiency by de-duplicating data assigned with a guarantee code that is different for each data.

BRIEF DESCRIPTION OF DRAWINGS

FIG. 8 is a flowchart showing the flow of the reclamation processing and refresh processing according to the same embodiment.

DESCRIPTION OF EMBODIMENTS

An embodiment of this invention is now explained in detail with reference to the drawings.

(1) First Embodiment (1-1) Hardware Configuration of Computer System

Figure 1:
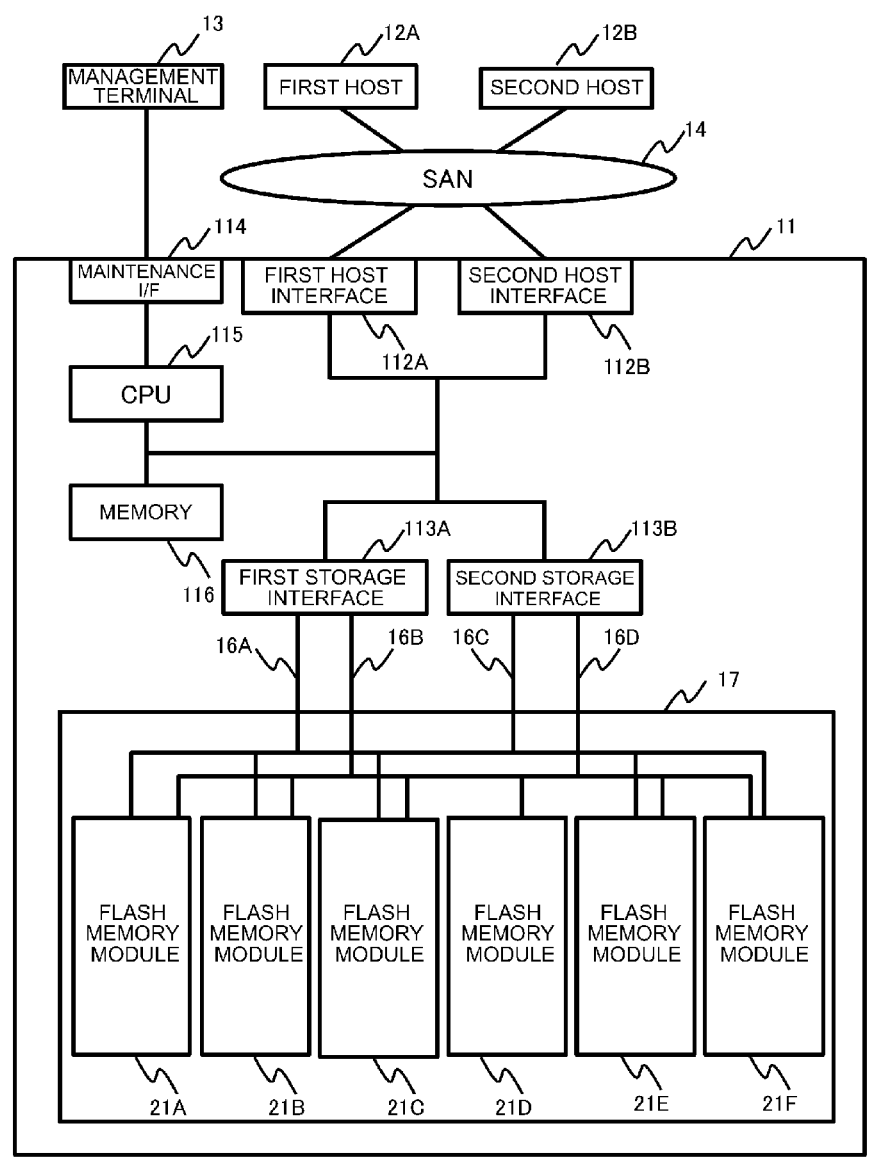
FIG. 1 is a block diagram showing the hardware configuration of the computer system according to the first embodiment of the present invention.

The hardware configuration of the computer system 1 according to this embodiment is foremost explained. As shown in FIG. 1, the computer system 1 according to this embodiment comprises a storage apparatus 11, first and second hosts 12A, 12B (the first and second hosts are hereinafter sometimes simply referred to as the "host 12"), a management terminal 13, and a SAN (Storage Area Network) 14.

The storage apparatus 11 interprets commands sent from the host 12, and executes reading/writing of data into a storage area of the storage apparatus 11. The storage apparatus 11 is configured, as shown in FIG. 1, from first and second host interfaces 112A, 112B (the first and second host interfaces are hereinafter sometimes simply referred to as the "host interface 112"), first and second storage interfaces 113A, 113B (the first and second storage interfaces are hereinafter sometimes simply referred to as the "storage interface 113"), a maintenance interface (I/F) 114, a CPU 115, a memory 116, connectors 16A, 16B, 16C, 16D (hereinafter simply referred to as the "connector 16"), a flash memory storage 17 and the like.

The host interface 112 is an interface for receiving data and control commands from the host 12. Moreover, the storage interface 113 is an interface for sending data and control commands to the flash memory storage 17. Moreover, the maintenance interface (I/F) 114 is an interface for receiving, from the management terminal 13, control commands and the like concerning management and maintenance by being connected to the management terminal 13.

The CPU 115 functions as an arithmetic processing unit, and has a function of controlling the operation of the overall storage apparatus 11 according to the various programs and arithmetic parameters stored in the memory 16. Specifically, the CPU 115 processes the data input/output (data I/O) to and from the host 12, and issues an I/O command concerning the data I/O to the flash memory storage 17. Moreover, the CPU 115 creates a guarantee code for the user data received from the host 12, and assigns it to the user data. In addition to storing various programs and arithmetic parameters, the memory 116 additionally stores control information and management information, and also temporarily stores data from the user.

The flash memory storage 17 is configured from flash memory modules 21A to 21F (hereinafter sometimes simply referred to as the "flash memory module 21"). Although the flash memory storage 17 is configured by comprising six flash memory modules 21 to 21F in this embodiment, there is no particular limitation on the number of flash memory modules. The flash memory module 21 is connected to the storage interface 113 via the connector 16, and the data and the respective control commands received from the host 12 via the connector 16 are written into the flash memory module 21. The internal configuration of the flash memory module 21 will be described later in detail. Note that, although the flash memory storage 17 is configured integrally with the storage apparatus 11 in this embodiment, the configuration is not limited to the foregoing example, and the flash memory storage 17 may be a device that is separate from the storage apparatus 11.

The host 12 is connected to the storage apparatus 11 via the SAN, and sends a data read/write request to the storage apparatus 11. Moreover, the host 100 is a computer device comprising information processing resources such as a CPU (Central Processing Unit) and a memory, and, for example, is configured from a personal computer, a workstation, a mainframe or the like. A block protocol such as SCSI (Small Computer System Interface) is used in the communication between the host 12 and the storage apparatus 11. Moreover, the host 20 comprises an information input device such as a keyboard, a switch, a pointing device or a microphone, and an information output device such as a monitor display or a speaker.

The management terminal 13 is a computer device comprising information processing resources such as a CPU and a memory, and, for example, is configured from a personal computer, a workstation, a mainframe or the like. The CPU functions as an arithmetic processing unit, and controls the operation of the overall management terminal 13 according to the various programs and arithmetic parameters stored in the memory. Moreover, the management terminal 13 comprises an information input device such as a keyboard, a switch, a pointing device or a microphone, and an information output device such as a monitor display and a speaker, and is a device for managing the storage apparatus 11 and the like according to the input made by the operator or the like.

Note that the number of hosts 12 and flash memory modules 21 and the number of connectors 16 for connecting the same are not limited to the numbers shown in FIG. 1, and may be a number that is one or more. Similarly, the standard of the respective connectors and interfaces is not limited to a specific standard. For example, as representative standards that can be applied to the SAN 14, there are FC (Fibre Channel), SCSI, iSCSI (interne Small Computer System Interface), SAS (Serial Attached SCSI) and the like.

The flash memory (flash memory module 21) is now explained. The flash memory is characterized in that its minimum erase unit is greater in comparison to its minimum write unit. Specifically, in flash memory, a plurality of pages are provided in one block, and data is erased in block units and the reading and writing of data is executed in page units.

As described above, with a flash memory, data cannot be directly rewritten due to its characteristics. Specifically, when rewriting data stored in a flash memory, the stored valid data is saved in another block, and the stored data is erased in block units. Then, the rewriting of data is performed by writing data into the block from which data was erased.

Thus, the data rewrite processing in a flash memory entails the erasure of data in block units. Nevertheless, the time that is required for erasing one block worth of data in a flash memory is longer by approximately a single digit in comparison to the time required for writing one page worth of data. Accordingly, if one block worth of data erase is executed each time in order to rewrite one page worth of data, the data rewrite performance of the flash memory will deteriorate. In other words, if a flash memory is used as the storage medium, it is necessary to write data using an algorithm that is able to hide the time spent on erasing data from the flash memory.

Normally, when rewriting data in a flash memory, data is not erased each time data is rewritten, and data is rewritten according to a method of recording data in an unused area where data is not recorded. Nevertheless, if the data rewrite processing is repeatedly executed, the unused area in the flash memory will become depleted. Thus, it becomes necessary to erase unnecessary data that is written into the flash memory and cause the storage area to be in a reusable state.

Thus, the execution of block reclamation processing (this processing is hereinafter referred to as the "reclamation processing") of copying only the valid data in a block containing old data to an unused area and erasing the block of the copy source so that it will become a reusable state is essential processing for the high speed rewriting of data in a flash memory. The reclamation processing is executed to blocks containing numerous invalid data.

Meanwhile, a flash memory is characterized in that there is a limitation in the number of times that data can be erased. For example, an erase count of 100,000 times per block is guaranteed. In the foregoing case, if the rewriting of data is concentrated on a single block and the erase count of such block increases, there is a problem in that data cannot be erased and the block becomes unusable. Thus, when using a flash memory as the storage medium, it is necessary to perform erase count leveling processing so that the data erase processing is not concentrated on a specific block.

Moreover, a flash memory is characterized in that a page that is once written will entail an increase in the read error rate pursuant to the lapse of time. An error that occurs merely as a result of retaining data is referred to as a retention error, and, in order to avoid this, write processing (refresh processing) of writing a page in which a given period of time has elapsed from the writing thereof is to a separate page is executed. Even upon executing the refresh processing, it is necessary to level the foregoing erase count or give consideration to the influence on the performance.

As described above, when a flash memory is being used as the storage medium, in order to hide the data erase time or level the data erase count, conversion processing of associating the logical address provided to the host system and the physical address of the actual storage area and converting the logical address to a physical address is performed upon writing the data. In other words, as a result of sequentially changing the correspondence of the logical address provided to the host system and the physical address of the storage area, the host system will only need to write data in a logical address space, and does not need to be aware of changes in the physical address or the like associated with the recording in an unused area during the writing of data.

If the logical address and the physical address are associated and managed in a storage apparatus including a flash memory as described above, the application of the de-duplication technology may be considered. De-duplication technology is technology of associating a plurality of logical address spaces storing the same data with one physical address space storing such data. As a result of using the de-duplication technology, it is possible to reduce the amount of data that is written, and prolong the life and improve the performance stability of a flash memory in a storage apparatus that uses a flash memory as its storage medium.

In particular, as target data in which the application of the de-duplication technology is considered to be effect, there is format data. Upon using a storage device, the storage apparatus 11 executes format processing of writing data of a specific pattern in the entire area of the storage device for the purpose of detecting an abnormal location of the storage device or writing a guarantee code in advance. The format processing entailed a problem in that the rewrite count is needlessly increased in a storage device such as a flash memory in which rewriting is limited.

Moreover, since a flash memory adopts a method of recording in an unused area for the rewriting of data, the data erase processing must be executed frequently as the unused area decreases. Thus, as a result of insubstantial data being written based on the format processing, there is a problem in that the unused area decreases and the performance stability is impaired. Thus, by applying the foregoing de-duplication technology, it is possible to reduce the amount of data that is written, and prolong the life and improve the performance stability of a flash memory in the storage apparatus 11 that uses a flash memory as its storage medium.

In addition, with the storage apparatus 11, in order to prevent bit errors of data stored in a data area caused by hardware failure or the like and the writing and reading to and from an unauthorized address due to an internal control error or the like, a guarantee code is assigned to the write data. Generally speaking, a guarantee code is a combination of a part that is calculated from the data content for the purpose of achieving data redundancy, and a part in which a value can be freely set for each vendor. If de-duplication is performed to data that is assigned with such a guarantee code, since the guarantee code portion will differ for each data, there is a problem in that de-duplication cannot be performed even if the data contents are the same since due to the difference in the guarantee code.

Thus, in this embodiment, upon performing de-duplication processing to data including a guarantee code, the guarantee code portion and the data portion of the target data are separated, only the data portion is subject to the de-duplication processing, and the guarantee code portion is managed separate from the data and managed by being stored in the flash memory for each data. Moreover, since the minimum write unit of a flash memory is a page unit as described above, the guarantee code portion is not simply separated and stored in the flash memory, and, rather, the guarantee code is efficiently stored by being aware of the write unit or executing the conversion from a logical address to a physical address.

In addition, with respect to data of a simple pattern such as the same value or incremental value as represented by the foregoing format data, the amount of data that is written can be reduced by further compressing the data part. In this embodiment, the compressed data part and the guarantee code related to such data are efficiently managed to comply with the foregoing write limit in the flash memory.

As described above, according to this embodiment, it is possible to perform de-duplication even to data assigned with a guarantee code, and prolong the life of the flash memory as a result of reducing the amount of data that is written in the storage medium. In addition, in a storage medium such as a flash memory adopting the recordable writing method, it is possible to improve the performance stability by increasing the unused area that is not being used by the user and using such unused area as an area for recording data.

(1-2) Internal Configuration of Storage Apparatus

The internal configuration of the storage apparatus 11 is now explained. The internal configuration of the flash memory module 21 is foremost explained. The flash memory module 21 is configured from a flash control device 210 and flash memory chips 31A to 31H (hereinafter sometimes simply referred to as the "flash memory 31"). Note that, although the flash memory chip 31 is configured from six flash memories shown in FIG. 2 in this embodiment, the flash memory chip 31 is not limited to the foregoing example and it will suffice so as long as there are one or more flash memories.

Figure 2:
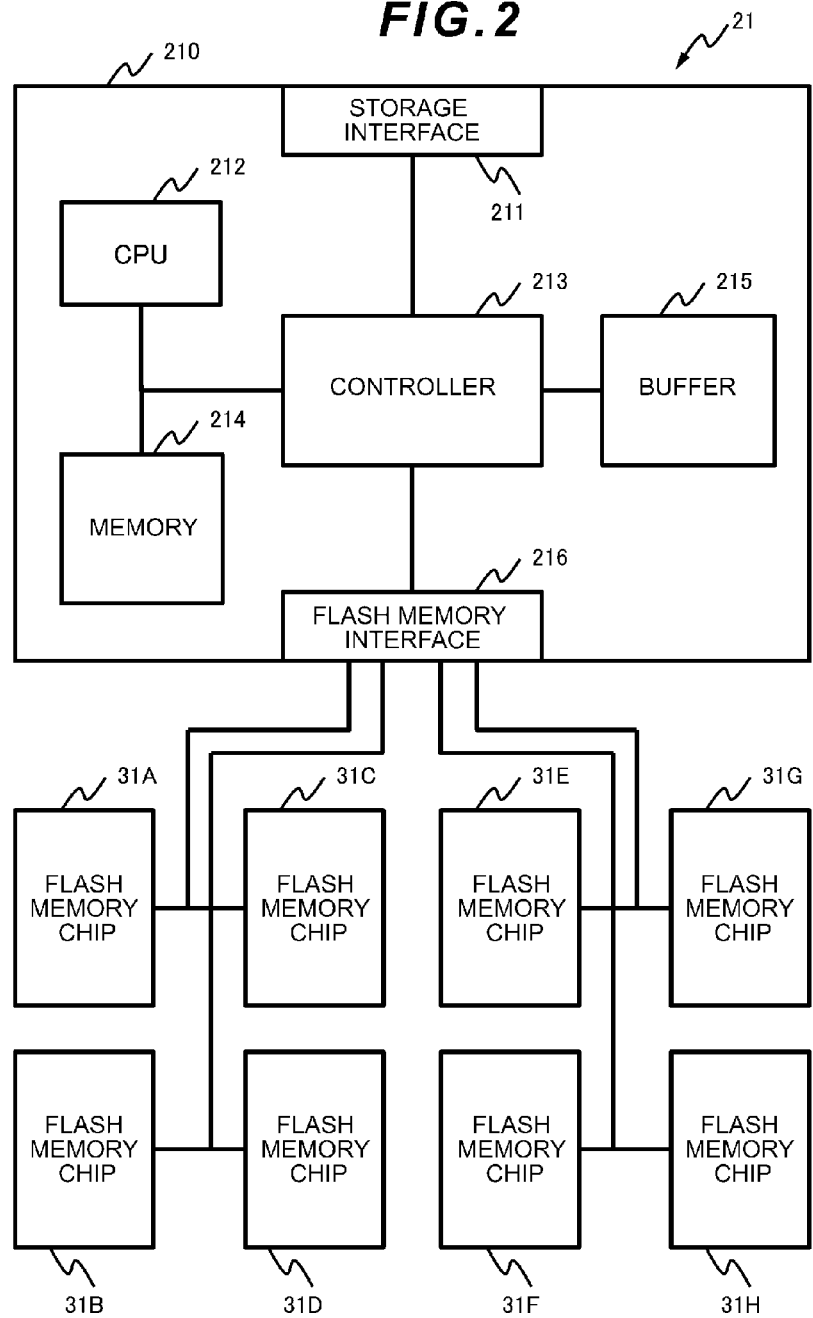
FIG. 2 is a block diagram showing the configuration of the flash memory module according to the same embodiment.

As shown in FIG. 2, the flash control device 210 comprises a storage interface 211, a CPU 212, a controller 213, a memory 214, a buffer 215, a flash memory interface 216, and the like.

The storage interface 211 is an interface for receiving data and control commands from the CPU 115 of the storage apparatus 11. The CPU 212 has a function of controlling the operation of the overall flash control device 210, and is operated based on the various programs stored in the memory 214. The CPU 212 reads/writes data from and to the flash memory chip 31 by referring to the various tables stored in the memory 214 in response to, for example, the data I/O from the host that was received via the storage interface 211. Moreover, in accordance with the usage of the flash memory chip 31, the CPU 212 executes reclamation for recycling the used area and executes leveling for evenly distributing the wear of the storage medium caused by the rewriting of data to the respective elements of the storage medium.

The controller 213 executes the reading/writing of data from and to the flash memory chips 31A to 31H under the control of the CPU 212. Moreover, the controller 213 also creates an error correction code for the data, compares the data for de-duplication, generates a hash value, and so on. Note that, in this embodiment, although the configuration is such that the controller 213 performs the processing for creating the error correction code and so on, the configuration is not limited to the foregoing example, and the configuration may be such as the CPU 212 executes the processing of the controller 213.

The memory 214 stores the various programs, various tables and control information to be executed by the CPU 212 and the controller 213. Note that the internal configuration of the flash control device 210 is not limited to the configuration shown in FIG. 2, and the respective functions may be executed with one or more devices.

Figure 3:
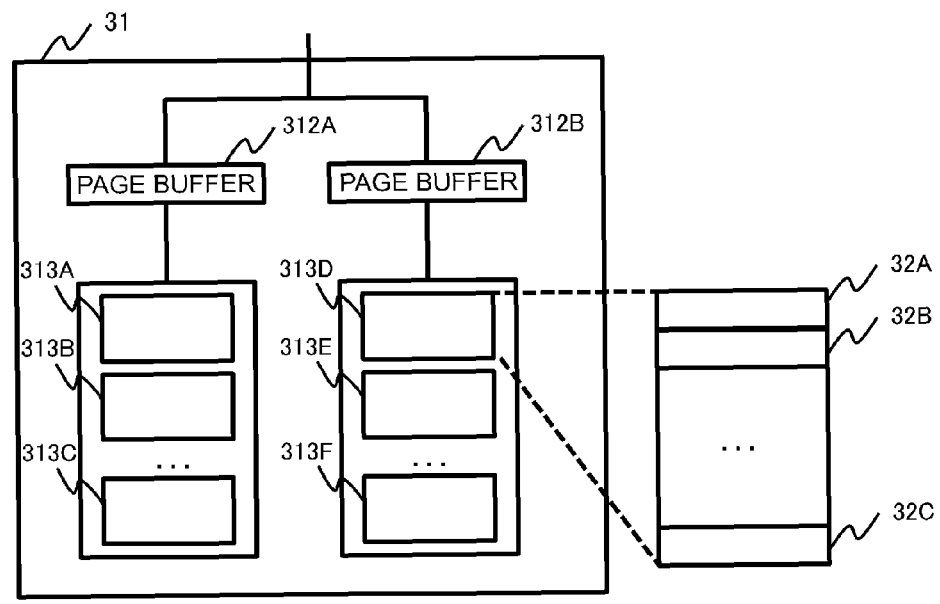
FIG. 3 is a block diagram showing the configuration of the flash memory chip according to the same embodiment.

The internal configuration of the flash memory chip 31 is now explained. As shown in FIG. 3, the flash memory chip 31 is configured from page buffers 312A, 312B (hereinafter sometimes simply referred to as the "page buffer 312") for temporarily storing the target data of the data I/O command issued from the flash control device 21, and physical blocks 313A to 313F (hereinafter sometimes simply referred to as the "physical block 313") as the actual storage area.

The physical block 313 is further configured from pages 32A to 32C (hereinafter sometimes simply referred to as the "page 32"). As described above, the physical block 313 is an erase unit in the flash memory, and the page 32 is a write/read unit in the flash memory. Moreover, the page 32 is an area that is divided into sizes such as 2 KB, 3 KB, 8 KB and the like, and the block 313 is an area that is divided into sizes of 128 pages or 256 pages, and has a size of 1 MB, 2 MB or the like.

Figure 4A:
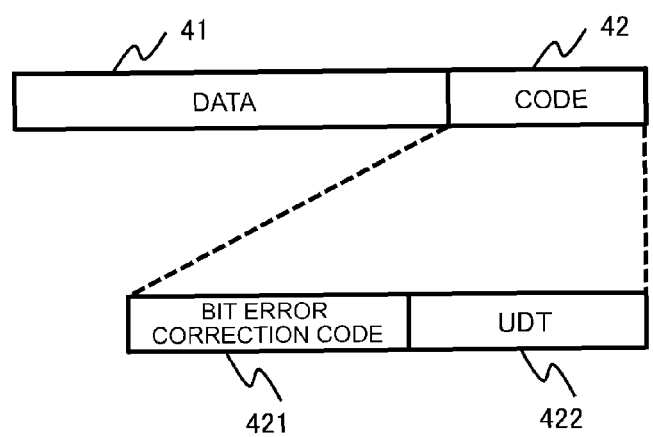
FIG. 4A is a conceptual diagram explaining the data contents according to the same embodiment.

The guarantee code of user data is now explained. As shown in FIG. 4A, the code (guarantee code) 42 to be assigned to the data (user data) 41 is assigned to the data 41 for each given section of the address. Generally speaking, a guarantee code of 8 B is created and assigned for one sector of each user data of 512B. The section of data is hereinafter sometimes referred to as a "sector" in the ensuing explanation.

The code 42 is configured from a bit error correction code part 421 that is created from the data 31, and a UDT part 422 which can be freely set by the vendor. The UDT part 422 stores, for example, the address of the relevant data for the purpose of confirming the consistency of the target data address. In the foregoing case, the UDT part 422 stores a unique value irrespective of the value of the user data 41.

Figure 4B:
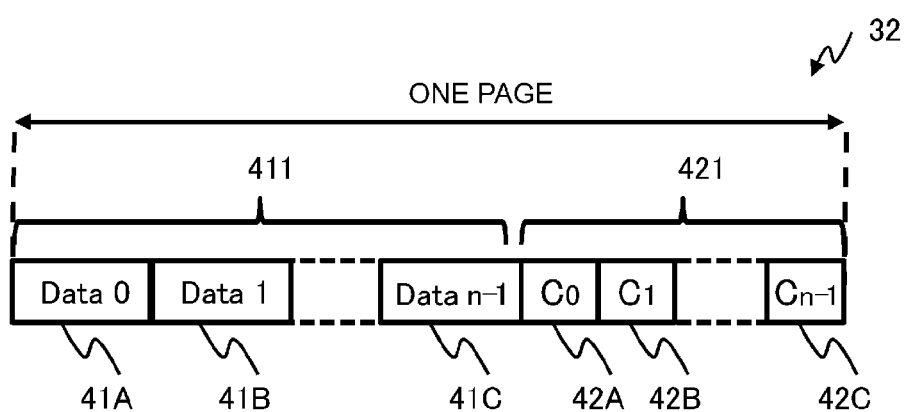
FIG. 4B is a conceptual diagram explaining the page contents according to the same embodiment.

Note that, since the page size of a flash memory is usually larger than 512 B, a plurality of sectors are stored in one page. Here, the page 32 will be configured as shown in FIG. 4B. Specifically, n-sectors can be stored in the page 32 of the flash memory, and the data parts 41A to 41C of the respective sectors are complied as the data part 411 of the page 32. Moreover, the codes 42A to 42C of the respective sectors are compiled as the code part 421 of the page. Note that the allocation of the data and guarantee code in the page is not limited to the configuration shown in FIG. 4B, and it will suffice so as long as the configuration allows the determination of the location of the data and guarantee code of the respective sectors. Moreover, in the foregoing explanation, although the code 42 among the sectors is made to be other than the data 41, the configuration is not limited to the foregoing example, and the bit error correction code 421 that is created from the user data may be stored in the data part 41 as a part of the data.

Figure 5:
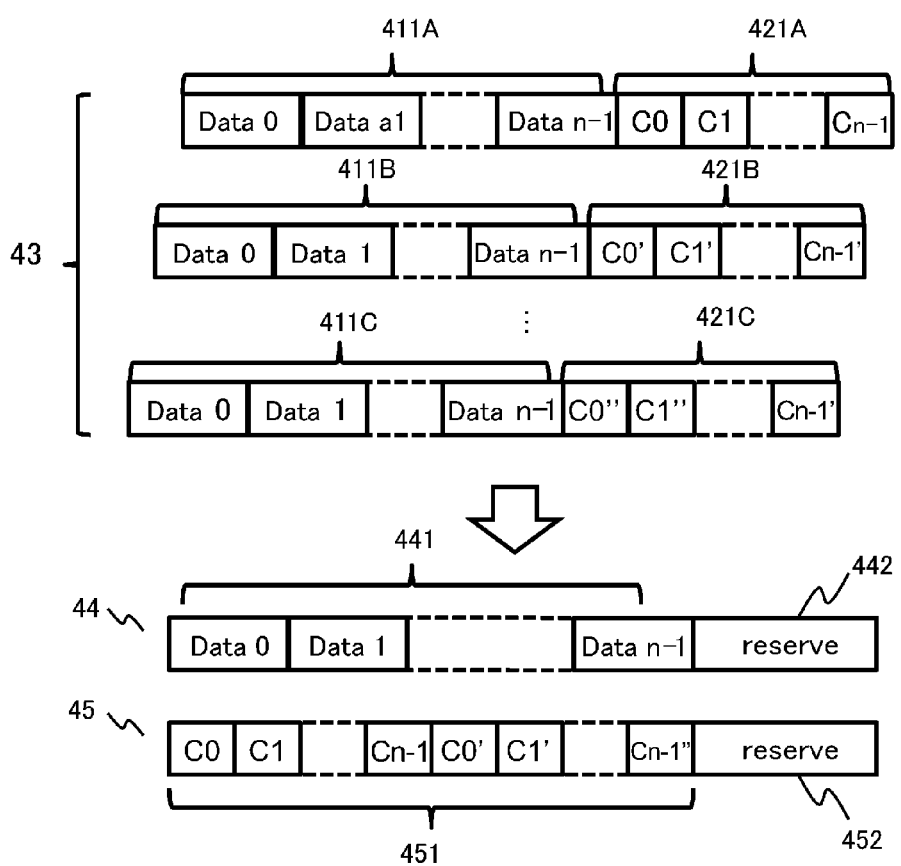
FIG. 5 is a conceptual diagram explaining the outline of the de-duplication processing according to the same embodiment.

The outline of the de-duplication processing according to this embodiment is now explained. As shown in FIG. 5, a page group 43 including three pages; namely, a page including the data part 411A and the code part 421A, a page including the data part 411B and the code part 421B, and a page including the data part 411C and the code part 421C can be stored in two pages; namely, the page 44 including the data part 441 and the page 45 including the code part 451 based on the de-duplication processing. Specifically, since the data stored in the data parts 411A, 411B, 411C is data containing the same contents, the data part is stored in the data part 441 of the page 44. However, since the guarantee codes that are stored in the code parts 421A, 421B, 421C are guarantee codes containing different contents, all guarantee codes of the code parts 421A, 421B, 421C are stored in the code part 451 of the page 45.

The respective logical address of the page group 43 and the physical address of the page 44 and the page 45 are associated. Specifically, the top of the logical address of the data parts 411A, 411B, 411C and the physical address of the page 44 are associated regarding the data part, and the respective physical addresses of the page 45 and the offset information from the top of such physical addresses are associated regarding the code part. Accordingly, if there are three or more pages including the data part and the code part and the contents of the data part are the same, the effect of reducing pages; namely, from three pages to two pages, can be achieved based on de-duplication. Note that, although unused spaces 422, 452 can be obtained in the page based on de-duplication, such unused spaces may be left unused, or used for storing the management information described later.

Figure 6:
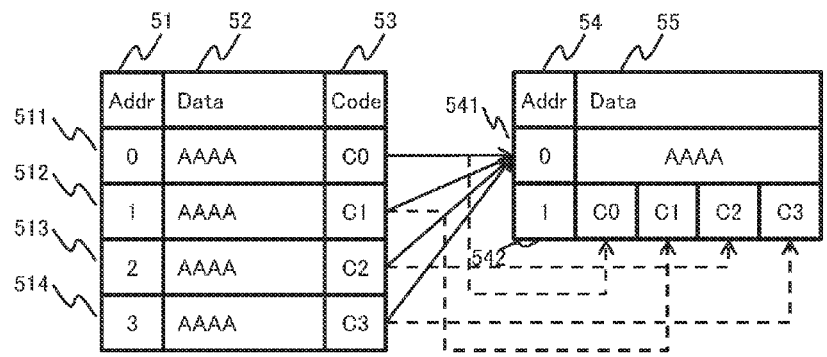
FIG. 6A is a conceptual diagram explaining the logical/physical page address according to the same embodiment.
FIG. 6B is a chart showing an example of the logical/physical address conversion table according to the same embodiment.
FIG. 6C is a chart showing an example of the dereference table according to the same embodiment.

A specific example of de-duplication is now explained. FIG. 6A shows the correspondence relation of a logical page address and a physical page address. As shown in FIG. 6A, Addr 51 shows the logical page address, and Data 52 shows the data stored in the logical page address space. Moreover, Code 53 shows the guarantee code that is stored in the logical page address space. Addr 54 shows the physical page address associated with the logical page, and Data 55 shows the contents of data stored in the physical page address space.

The data 52, which is stored in the logical pages 511 to 514 shown as logical page addresses 0 to 3, stores data "AAAA" of the same contents. In the foregoing case, the respective logical page addresses 0 to 3 of the logical pages 511 to 514 are associated with the physical page address 0 of the physical page 541 storing the data of "AAAA". Nevertheless, since the physical page 541 only stores user data that does not include the guarantee code, the physical page address 1 of the physical page 542 storing the guarantee code is associated with the respective logical pages 511 to 514. In addition, at what location the guarantee code corresponding to the respective logical pages 511 to 514 exists from the top code of the physical page address 1 is associated as the offset information.

The management table for realizing the foregoing association of the logical page and the physical page is now explained. The management table is stored in the memory 214 of the flash memory module 21. Moreover, the controller 213 of the flash memory module 21 executes the de-duplication processing and creates various management tables. Subsequently, under the control of the CPU 212 of the flash memory module 21, the controller 21 refers to the management table and executes the reading/writing of data from and to the flash memory chip 31.

The logical/physical address conversion table 56 is a table for managing the association of the logical address and the physical address, and specifically for managing on which physical page the data and guarantee code stored in the logical page address exists. The logical/physical address conversion table 56 is configured, as shown in FIG. 6B, from a logical page address column 561, a physical page data address column 562, a physical page code address column 563 and a physical page code offset address column 564.

The logical page address column 561 stores the top address of the logical pages. The physical page data address column 562 stores the top address of the physical pages storing the data parts corresponding to the addresses stored in the logical page address column 561. The physical page code address column 563 stores the top address of the physical pages storing the code parts corresponding to the addresses stored in the logical page address column 561. Note that, since the logical page address is represented as an offset position from the top of the table, in reality there is no need to store it in the memory, but here it is indicated as an element in the table for the sake of convenience.

The physical page code offset address 564 stores the address showing the storage location of the guarantee code corresponding to the guarantee code of the respective logical pages among the codes among the pages which are shown with the address stored in the physical page code address column 563. As described above, based on the logical/physical address conversion table 56, it is possible to obtain the location storing the data and guarantee code of the physical page corresponding to the data and guarantee code contained in the logical page.

Note that, in FIG. 6B, although the physical page code offset address column 564 stores the offset address of the guarantee code, it is also possible to recognize the physical location of the guarantee code without providing the physical page code offset address column 564. Specifically, as a result of establishing a restriction to the effect that the arrangement of the addresses of the page group to be de-duplicated must be in sequence, the physical location of the guarantee code can be recognized without requiring the physical page code offset address. Moreover, with respect to pages that are not subject to de-duplication, whether such pages are subject to de-duplication can be determined by providing a flag to such pages or setting the physical page data address and the physical page code address to be the same value.

The dereference table 57 is now explained. The dereference table 57 is a table for managing which logical page is referring to the physical page and is configured, as shown in FIG. 6C, from a physical page address column 571, a reference count column 572 and a logical page address column 573.

The physical page address column 571 stores the top address of the physical pages storing the data and guarantee code. The reference count column 572 stores the number of logical pages referring to the data stored in the physical pages. Accordingly, if the logical page that was referring to the physical page is updated and such physical page is no longer referred to, the reference count is decremented. The logical page address column 573 stores the logical page address to become the reference source. If one physical page is being referred to by a plurality of logical pages, a plurality of logical page addresses to become the reference source are stored in a plurality of logical page address columns 573. Here, one physical page can be referred to from a maximum of n-logical pages.

The dereference table 57 can be used to determine whether a physical page is being referred to when, for example, the reclamation processing is executed, and the logical page address to be subject to reallocation can be acquired from the logical page address 573 to become the reference source.

As described above, although processing such as the writing/reading of data can be sped up by storing the foregoing management table in the memory 214 of the flash control device 210, the configuration is not limited thereto, and it may be stored in the flash memory 31 if the size of the management table is large in relation to the capacity of the memory 241. In the foregoing case, for example, the unused spaces 442 and 452 and the like in the physical page may be used.

Moreover, as described above, although the creation and management of the management table are performed by the flash control device 210, the configuration is not limited thereto, such creation and management may also be performed by a device capable of recognizing the page structure of the flash memory, performing the de-duplication processing of write data, and retaining management information. For example, the CPU 115 of the storage apparatus may perform the creation and management of the management table. However, although there is no need to newly provide a management table in the flash control device 21 since the association of the logical address and the physical address is essential, it is necessary to newly provide the foregoing management table if the CPU 115 of the storage apparatus is to manage the association of the logical address and the physical address.

(1-3) Detailed Operation of Storage Apparatus (1-3-1) De-Duplication Processing

Figure 7:
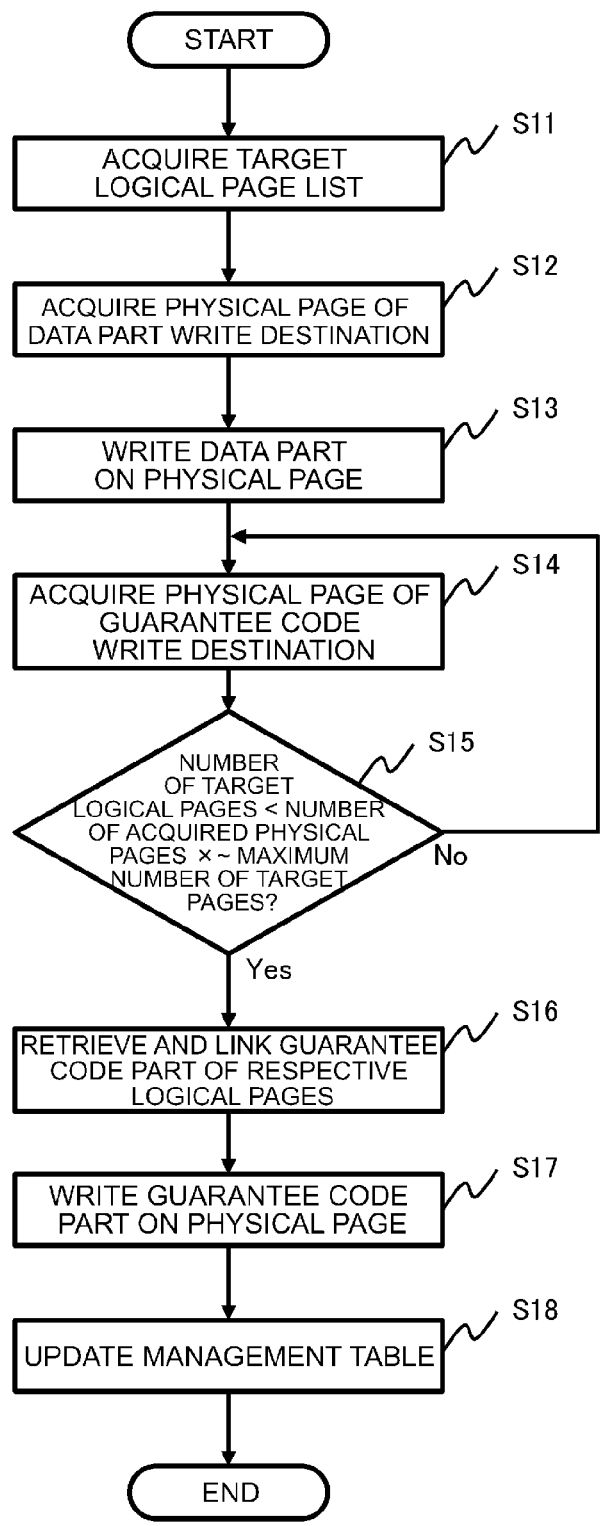
FIG. 7 is a flowchart showing the flow of the de-duplication processing according to the same embodiment.

The de-duplication processing in the storage apparatus 11 is now explained. As described above, the controller 213 of the flash memory module 21 executes the de-duplication processing. As shown in FIG. 7, the controller 213 foremost acquires the logical page list to be de-duplicated (S11). A logical page list is configured from two or more pages in which the contents of the data part stored in the user data in the page are the same, and the contents of the code part stored in the guarantee code are different.

As a method of searching for the logical page, for example, the combination of logical pages to be de-duplicated is searched among large-size data upon writing large-size data or during data reallocation in the reclamation processing or the refresh processing. Moreover, it is also possible to calculate and manage the hash value of the data part of the respective pages, and dynamically search for the combination of pages coinciding with the data part based on the hash value.

Subsequently, the controller 231 acquires the physical page for storing the data part of the logical page acquired at step S11 (S12). For example, the controller 231 may preferentially acquire a physical page with a low wear level from the perspective of prolonging the life of the flash memory. However, the acquisition policy of the physical page is not limited to the foregoing example, and the physical page may also be acquired based on a policy set by the administrator.

The controller 231 thereafter writes the user data stored in the data part of the logical page acquired at step S11 in the physical page acquired at step S12 (S13). However, the controller 231 does not necessarily have to write the data at step S13. For example, the writing of data may also be registered in a scheduler or the like.

Subsequently, the controller 231 acquires one page among the physical pages storing the code part of the logical page acquired at step S11 (S14). Here, the block of the physical page storing the code part is made to be a block that is different from the block of the physical page to become the write destination of the data part acquired at step S12. It is thereby possible to separately read the data part and the code part upon reading/writing data, and perform, in parallel, the processing to the data part and the processing to the code part.

Subsequently, the controller 231 determines whether the physical pages acquired at step S14 are of a required number (S15). Specifically, the controller 231 determines whether the capacity of the guarantee codes for the number of logical pages to be de-duplicated is less than the capacity of the acquired physical pages. The capacity required for storing the guarantee codes will be guarantee code size * number of logical pages to be de-duplicated. Moreover, the maximum number of guarantee codes (maximum number of target pages) that can be stored in one physical page can be calculated by dividing the physical page size by the guarantee code size. Accordingly, the controller 231 determines whether the physical pages are of a required number by determining whether the number of target logical pages is smaller than a number obtained by multiplying the number of acquired physical pages by the maximum number of target pages.

If it is determined that the physical pages are of a required number at step S15, the controller 231 executes the processing of step S16. Meanwhile, if it is determined that the physical pages are not of a required number at step S15, the controller 231 repeats the processing of steps S14 and S15.

The controller 231 thereafter extracts and links the code part of the respective logical pages to be de-duplicated (S16). Specifically, the controller 231 links the code parts that were extracted from the respective logical pages so that they will be within the physical page size.

Subsequently, the controller 231 writes the guarantee codes that were linked at step S16 into the physical page (S17). If the controller 231 has acquired a plurality of physical pages for writing the guarantee codes, the linked guarantee codes are written into the respective physical pages.

The controller 231 thereafter updates the logical/physical address conversion table 56 and the dereference table 57, which are management tables (S18). Specifically, the controller 231 updates the value of the physical page data address column 562 to the value of the physical page address of the data storage destination and updates the value of the physical page code address column 563 to the value of the physical page address of the guarantee code storage destination regarding the entries corresponding to the logical pages to be de-duplicated in the logical/physical address conversion table 56. Moreover, the controller 231 stores, in the physical page code offset address column 564, the location of the respective guarantee codes in the physical page to become the storage destination of the guarantee codes.

Moreover, the controller 231 updates the entries corresponding to the physical page associated with the logical page to be de-duplicated in the dereference table 57. Specifically, by updating the address of the logical page to be de-duplicated, the value of the reference counter column 572 is decremented for the physical page that is no longer referred to. The address of the logical page that is no longer referred to is deleted from the logical page address column 573.

Note that the update of the logical/physical address conversion table 56 also needs to be performed in the normal write (writing) processing in which de-duplication processing is not performed. Specifically, it is necessary to associate the address of the logical page and the address of the physical address to become the new write destination, and delete the address of the logical page that was referring to the physical page from the entry of the physical page of the original storage destination.

(1-3-2) Reclamation Processing and Refresh Processing

The reclamation processing and refresh processing are now explained in detail. As shown in FIG. 8, the controller 231 foremost acquires a physical block list to be subject to reclamation or refresh (S21). For example, the controller 231 causes a physical block with numerous invalid pages to be subject to reclamation processing, and causes a physical block that has not been accessed for a long period of time to be subject to refresh processing.

Subsequently, the controller 231 determines whether processing was performed to all physical blocks included in the physical block list acquired at step S21 (S220). If it is determined at step S220 that processing was performed to all physical blocks, the controller 231 executes the processing of step S221 onward. Meanwhile, if it is determined at step S220 that processing was not performed to all physical blocks, the controller 231 executes the processing of step S22 onward.

The controller 231 thereafter determines whether there is a physical page, among all physical pages in the physical block, in which the value of the reference count column 572 in the dereference table 57 is greater than 0 (S22). If it is determined at step S22 that there is a physical page in which the value of the reference count column 572 is greater than 0, the processing of step S23 onward is executed, and if it is determined that there is no physical page in which the value of the reference count column 572 is greater than 0, the processing of step S221 onward is executed.

The controller 231 thereafter acquires one physical page X among the target physical pages in which the value of the reference count column 572 is greater than 0 (S23). The physical page acquired at step S23 is referred to as the physical page X in the ensuing explanation. Then the controller 231 acquires the entries corresponding to the physical page X of the dereference table 57 (S24). In addition, the controller 231 acquires, from the reference source logical page address column 573, the address of the logical page that is referring to the physical page X (S25). The controller 231 thereafter checks the reference source logical page registered in the reference source logical page address column 573.

Subsequently, the controller 231 checks whether the logical page acquired at step S25 is still referring to the target physical page X (S26). Note that the processing of step S26 is not required if the address of the logical page that is no longer referring to the physical page has been deleted from the reference source logical page address column 573 of the dereference table 57 during the update processing (step S18) of the management table that is executed during the de-duplication processing or the normal write processing. Meanwhile, if the dereference table 57 is stored in the flash memory and cannot be updated easily, it is necessary to confirm at step S26 regarding whether the physical page X is being referred to.

Subsequently, the controller 231 adds the logical page referring to the physical page X to the copy target list (S27). The controller 231 ultimately sets the logical page referring to the physical page X to 0, and realizes a state where the physical block can be erased. The controller 231 may also only add the copy target logical page to the list at step S27, and subsequently perform the actual copy processing of the logical page at an arbitrary timing.

Subsequently, the controller 231 confirms the referral regarding all logical pages that could be referring to the physical page X (S28). If there is a logical page in which the reference to the physical page X has not been confirmed at step S28, the controller 231 repeats the processing of step S26 onward. Meanwhile, if it is determined at step S28 that the reference to the physical page X regarding all logical pages has been confirmed, the controller 231 returns to the processing of step S220.

The controller 231 thereafter attempts to perform the de-duplication processing to the logical pages included in the copy target list created at step S27 (S221). Specifically, the controller 231 executes the de-duplication processing to the logical pages having the same data part among the logical pages included in the copy target list.

Subsequently, after executing the de-duplication processing at step S221, the controller 231 copies the logical pages remaining in the copy target list to a physical page to become the copy destination (S222). The controller 231 thereafter erases the physical blocks that were subject to the reclamation processing or the refresh processing at step S21 (S223).

(1-3-3) Merge Processing

The merge processing is now explained. Here, merge processing refers to the processing of additionally merging the logical pages or physical pages having the same data regarding the logical pages that have previously been subject to the de-duplication processing. The foregoing de-duplication processing is executed when writing large-size data or during the reclamation processing or refresh processing as described above. Accordingly, there are cases where a logical page not yet subject to the de-duplication processing exists in the same flash memory module 21. Moreover, if a plurality of flash memory modules 21 exist in the storage apparatus 11, since the de-duplication processing is performed in the respective flash memory modules 21, there are cases where a logical page containing the same data exists in a plurality of flash memory modules. In the foregoing case, the same data can be integrated by performing merge processing to realize the further reduction of the data capacity.

Figure 9A:
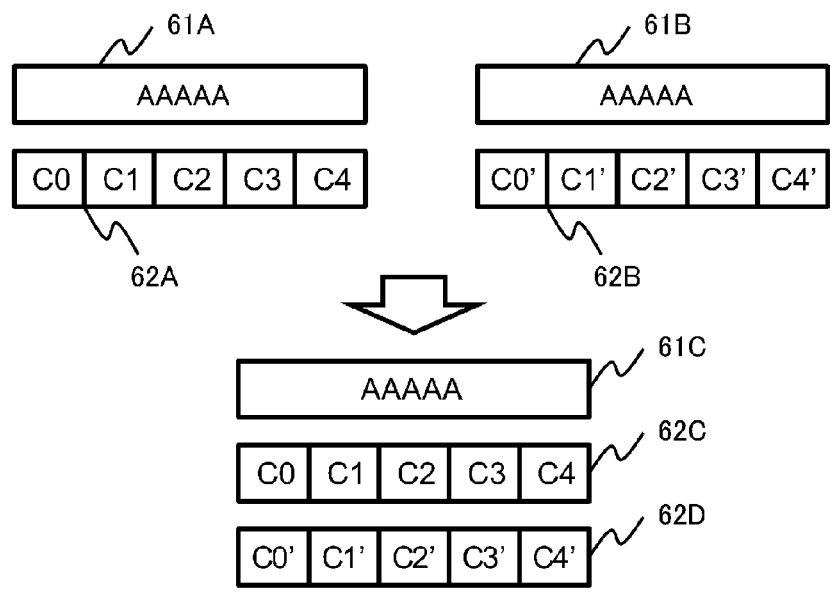
FIG. 9A is a conceptual diagram explaining the outline of the merge processing according to the same embodiment.

For example, as shown in FIG. 9A, let it be assumed that there are two sets of physical pages storing de-duplicated logical pages. Let it be further assumed that the two physical pages 61A and 61B storing the data part are storing the same data. Moreover, the two physical pages 62A and 62B storing the guarantee codes are respectively storing the guarantee codes of the logical page list. The data parts of these two sets of physical pages can be further shared and the four physical pages 61A, 61B, 62A, 62B can be combined into three physical pages 61C, 62C, 62D.

As shown in FIG. 9A, when four physical pages are combined into three physical pages, the physical pages 62A and 62B storing the guarantee codes are used as is as the physical pages 62C, 62D, and one of either the physical page 61A or 61B storing the data is used as the physical page 61C, and the other is made to be an invalid page. However, if management information of the logical/physical address conversion table 56 or the like is stored in the unused area 442 of a physical page, it is necessary to newly assign a physical page to be used for storing data. When newly assigning a physical page to be used for storing data, both of the physical pages 61A and 61B storing the data are made to be invalid pages.

Figure 9B:
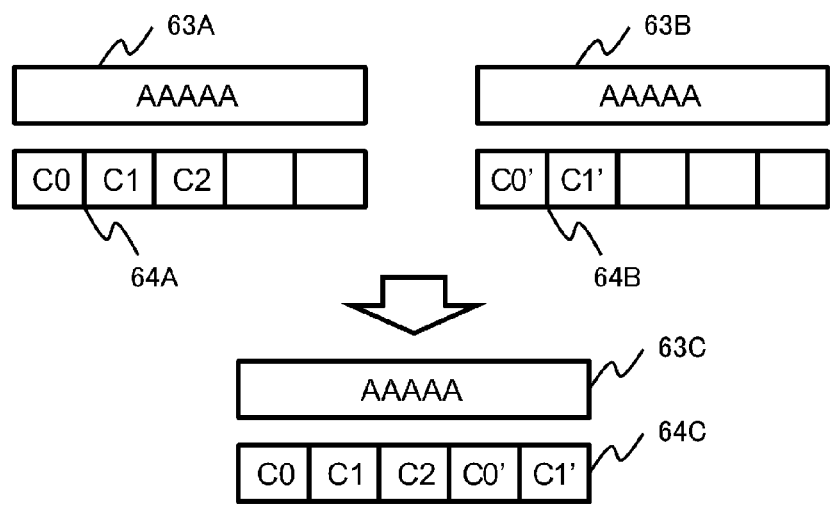
FIG. 9B is a conceptual diagram explaining the outline of the merge processing according to the same embodiment.

Moreover, of the set of physical pages storing the de-duplicated logical pages, if there is an unused area in the physical page storing the guarantee code part, the guarantee codes can also be merged. For example, as shown in FIG. 9B, the guarantee codes stored in the physical page 64A and the physical page 64B are respectively extracted and copied to the physical page 64C. The physical page 64A and the physical page 64B thereafter become invalid pages and are abandoned. Moreover, with respect to the physical pages 63A and 63B storing data, since the same data is stored, as with FIG. 9A, one of either the physical page 63A or 63B is used as the physical page 63C, and the other is made to be an invalid page. As described above, as a result of combining the code parts in addition to the data parts, four physical pages can be combined into two physical pages.

Figure 10:
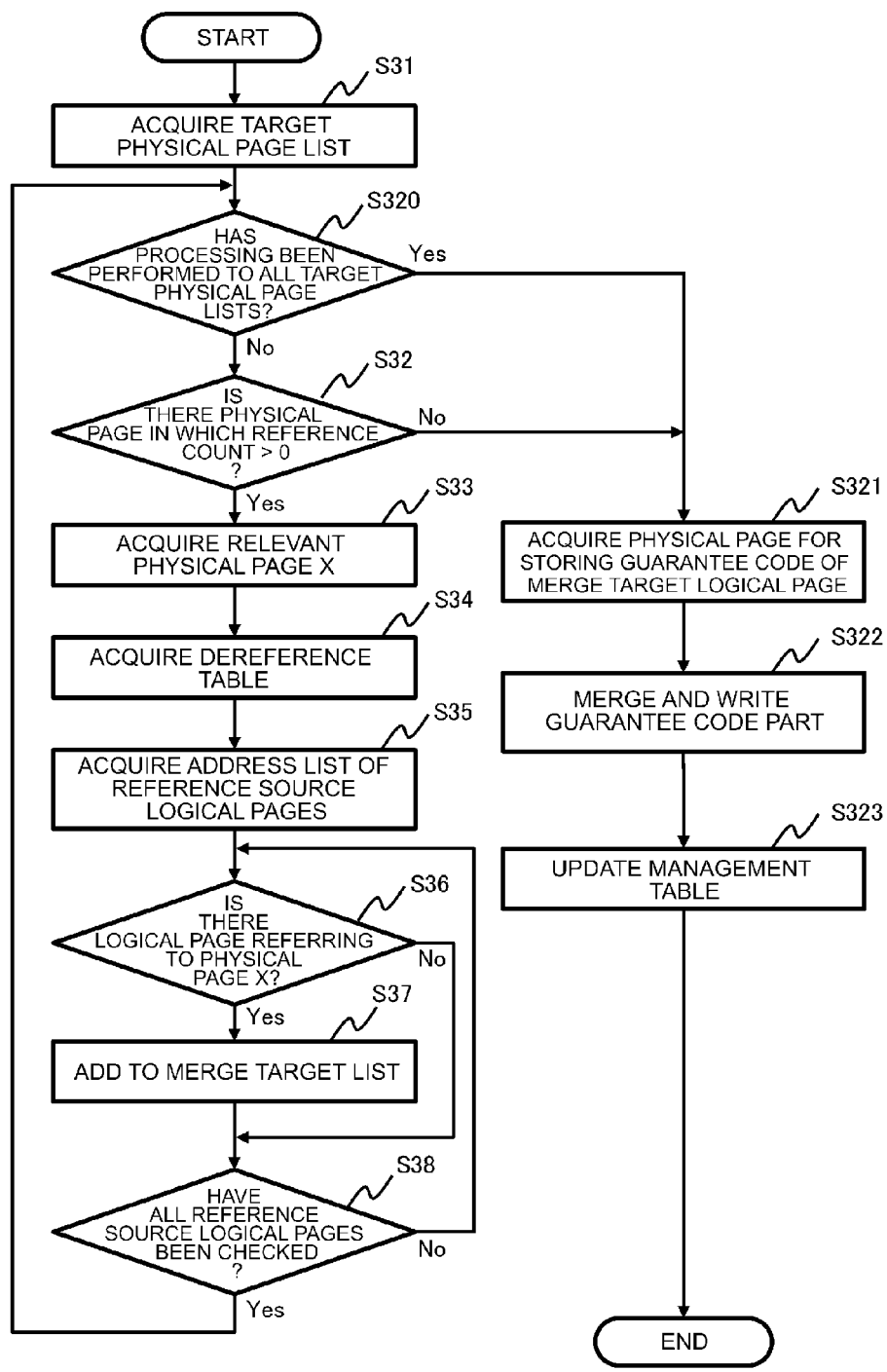
FIG. 10 is a flowchart showing the flow of the merge processing according to the same embodiment.

The processing routine of the merge processing is now explained. As shown in FIG. 10, the controller 231 foremost acquires the physical page lists to be merged (S31). Specifically, the controller 231 acquires, among the physical page lists, the physical page lists which are a collection of valid pages, pages that were subject to de-duplication processing, and physical pages in which the data parts are equal. The physical page lists are created by searching for data of the physical pages upon, for example, writing large-size data or processing large-size data based on the reclamation processing or refresh processing. Moreover, it is also possible to calculate and manage the hash value of the data part of the respective physical pages, and dynamically search for the combination of pages coinciding with the data part based on the hash value in order to create the physical page lists.

The controller 231 thereafter determines whether processing has been performed to all physical page lists acquired at step S31 (S320). If it is determined at step S320 that processing has been performed to all physical pages, the controller 231 executes the processing of step S321 onward. Meanwhile, if it is determined at step S320 that processing has not been performed to all physical blocks, the controller 231 executes the processing of step S32 onward.

The controller 231 thereafter determines whether there is a physical page, among all physical pages acquired at step S31, in which the value of the reference count column 572 in the dereference table 57 is greater than 0 (S32). If it is determined at step S32 that there is a physical page in which the value of the reference count column 572 is greater than 0, the processing of step S33 onward is executed, and if it is determined that there is no physical page in which the value of the reference count column 572 is greater than 0, the processing of step S321 onward is executed.

The controller 231 thereafter acquires one physical page X among the target physical pages in which the value of the reference count column 572 is greater than 0 (S33). The physical page acquired at step S33 is referred to as the physical page X in the ensuing explanation. Then the controller 231 acquires the entries corresponding to the physical page X of the dereference table 57 (S34). In addition, the controller 231 acquires, from the reference source logical page address column 573, the address of the logical page that is referring to the physical page X (S35). The controller 231 thereafter checks the reference source logical page registered in the reference source logical page address column 573.

Subsequently, the controller 231 checks whether the logical page acquired at step S35 is still referring to the target physical page X (S36). Note that the processing of step S36 is not required if the address of the logical page that is no longer referring to the physical page has been deleted from the reference source logical page address column 573 of the dereference table 57 during the update processing (step S18) of the management table that is executed during the de-duplication processing or the normal write processing. Meanwhile, if the dereference table 57 is stored in the flash memory and cannot be updated easily, it is necessary to confirm at step S36 regarding whether the physical page X is being referred to.

Subsequently, the controller 231 adds the logical page referring to the physical page X to the merge target list (S37). The controller 231 thereafter confirms the referral regarding all logical pages that could be referring to the physical page X (S38). If there is a logical page in which the reference to the physical page X has not been confirmed at step S38, the controller 231 repeats the processing of step S36 onward. Meanwhile, if it is determined at step S38 that the reference to the physical page X regarding all logical pages has been confirmed, the controller 231 returns to the processing of step S320.

Subsequently, the controller 231 acquires physical pages for storing the guarantee codes storing the logical pages included in the merge target list created at step S37 (S321). Specifically, the controller 231 acquires physical pages in a quantity corresponding to the number of target logical pages.

The controller 231 thereafter merges the guarantee codes of the logical pages to be merged, and writes the guarantee codes in the physical pages acquired at step S321.

The controller 231 thereafter updates the logical/physical address conversion table 56 and the dereference table 57, which are management tables (S323). Specifically, the controller 231 updates the value of the physical page data address column 562 to the value of the physical page address of the data storage destination and updates the value of the physical page code address column 563 to the value of the physical page address of the guarantee code storage destination regarding the entries corresponding to the logical pages to be merged in the logical/physical address conversion table 56. Moreover, the controller 231 stores, in the physical page code offset address column 564, the location of the respective guarantee codes in the physical page to become the storage destination of the guarantee codes.

Moreover, the controller 231 updates the entries corresponding to the physical page associated with the logical page to be de-duplicated in the dereference table 57. Specifically, by updating the address to become the association destination of the logical page, the value of the reference counter column 572 is decremented for the physical page that is no longer referred to, and the address of the logical page that is no longer referred to is deleted from the logical page address column 573.

Note that the update of the logical/physical address conversion table 56 also needs to be performed in the normal write (writing) processing in which de-duplication processing is not performed. Specifically, it is necessary to associate the address of the logical page and the address of the physical address to become the new write destination, and delete the address of the logical page that was referring to the physical page from the entry of the physical page of the original storage destination.

(1-3-4) Read Processing

Figure 11:
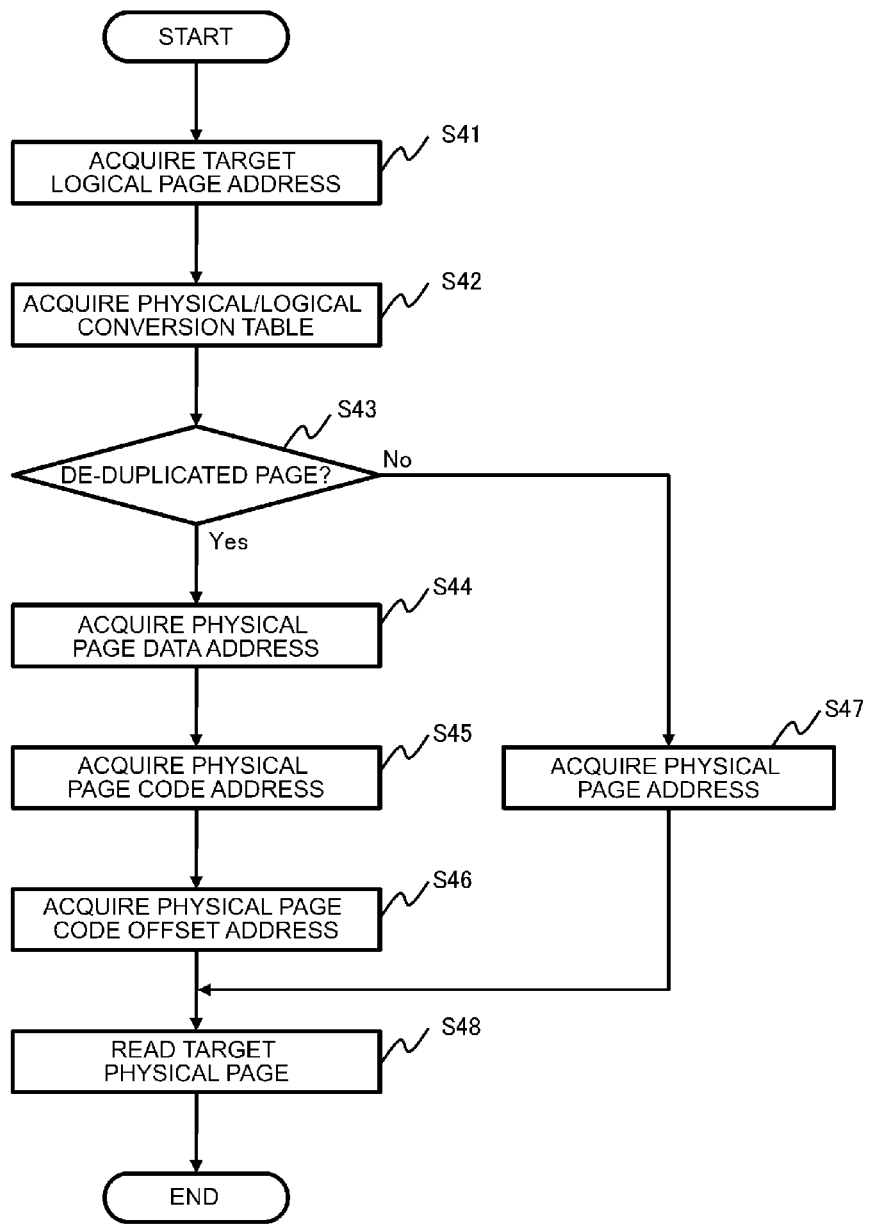
FIG. 11 is a flowchart showing the flow of the read processing according to the same embodiment.

The processing routine of the read processing is now explained. As shown in FIG. 11, the controller 231 acquires a logical page address to be read (S41). Specifically, the controller 231 acquires a read command from the host 12, or a logical page address to be read during the copy of internal control such as reclamation processing or refresh processing.

Subsequently, the controller 231 acquires the target logical/physical address information from the logical/physical address conversion table 56 (S42). The controller 231 thereafter determines whether the logical page acquired at step S41 is a page that was subject to de-duplication processing (S43). Specifically, the controller 231 may determine that a logical page has not been subject to de-duplication if the address stored in the physical page data address column 562 of the logical/physical address conversion table 56 and the address stored in the physical page code address column 563 are the same address.

If it is determined at step S43 that the logical page is a de-duplicated page, the controller 231 executes the processing of step S44 onward. Meanwhile, if it is determined at step S43 that the logical page is a page that has not been de-duplicated, the controller 231 executes the processing of step S47.

When it is determined that the logical page is a de-duplicated page, the controller 231 acquires the physical page data address storing the data parts of the logical page (S44). The controller 231 thereafter acquires the physical page code address storing the guarantee codes of the logical page (S45). In addition, the controller 231 acquires the physical page code offset address showing the physical location of the guarantee codes of the logical page (S46).

Moreover, if it is determined at step S43 that the logical page is a normal page that has not been de-duplicated, the controller 231 acquires the address of the physical page corresponding to the logical page (S47). Specifically, the controller 231 acquires the physical page data address stored in the physical page data address column 562 of the logical/physical address conversion table 56.

Subsequently, the controller 231 reads the data stored in the physical page based on the physical page address associated with the logical page to be read (S48).

(1-4) Effect of this Embodiment

As described above, with the computer system 1 according to this embodiment, among the plurality of data which are written into a flash memory chip, the plurality of data having common user data are divided into user data and a guarantee code, one user data is stored in a physical page, and the guarantee codes corresponding to the plurality of user data are linked and stored in a physical page. It is possible to perform de-duplication even to data assigned with a guarantee code, and prolong the life of the flash memory as a result of reducing the amount of data that is written in the storage medium. In addition, in a storage medium such as a flash memory adopting the recordable writing method, it is possible to improve the performance stability by increasing the unused area that is not being used by the user and using such unused area as an area for recording data.

(2) Second Embodiment

(2-1) Hardware Configuration of Computer System

Since the hardware configuration of the computer system 2 according to this embodiment is the same as the hardware configuration of the computer system 1 according to the first embodiment, the detailed explanation thereof is omitted. This embodiment is common with the first embodiment in that the de-duplication of a plurality of logical pages is performed, but differs from the first embodiment in that the data part to be de-duplicated is additionally compressed. Note that, in this embodiment also, as a method of searching for the logical page to be de-duplicated, for example, the combination of logical pages to be de-duplicated is searched among large-size data upon writing large-size data or during data reallocation in the reclamation processing or the refresh processing. Moreover, it is also possible to calculate and manage the hash value of the data part of the respective pages, and dynamically search for the combination of pages coinciding with the data part based on the hash value. Note that, in this embodiment, the logical page is sectioned at regular intervals for facilitating the explanation, and the ensuing explanation refers to logical pages with consecutive addresses.

(2-2) Internal Configuration of Storage Apparatus

With respect to the internal configuration of the storage apparatus 11 according to this embodiment, the detailed explanation of the same configuration as the first embodiment is omitted, and the configuration that is different from the first embodiment is explained in detail. The outline of the de-duplication in this embodiment which is different from the first embodiment is foremost explained.

Figure 12:
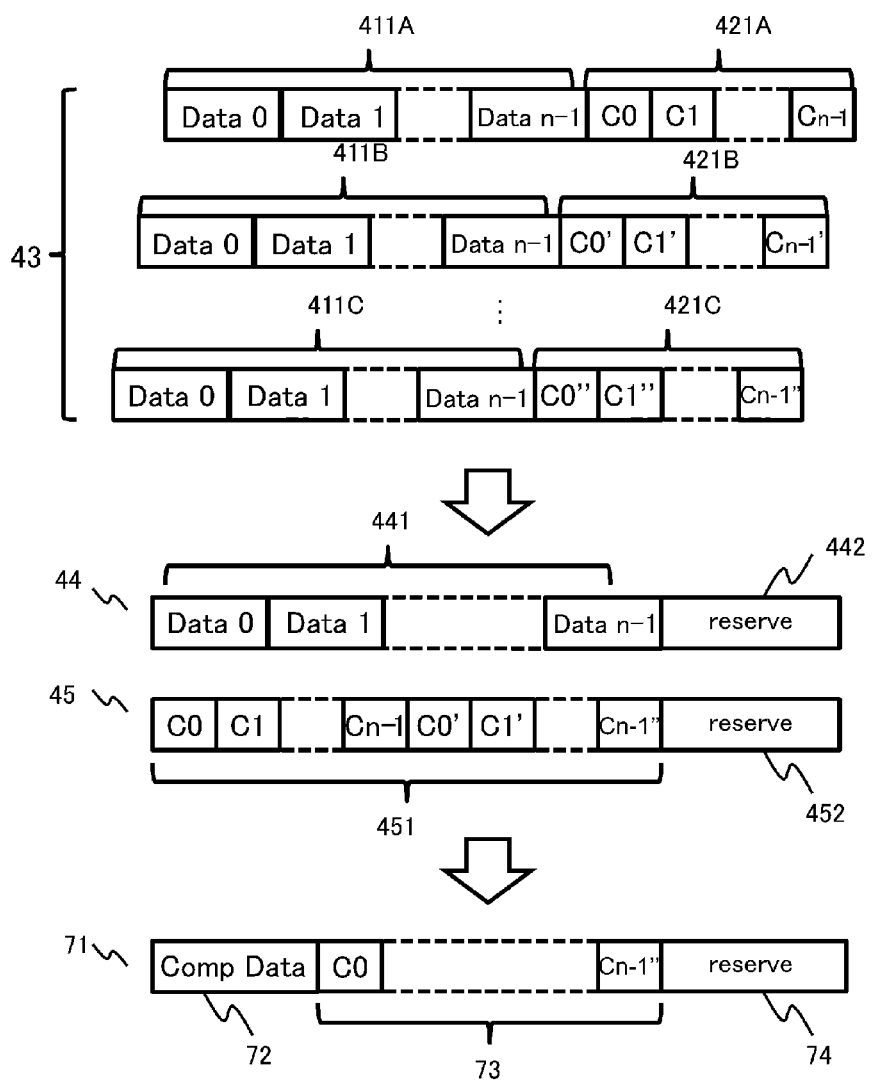
FIG. 12 is a conceptual diagram explaining the outline of the de-duplication processing according to the second embodiment of the present invention.

As shown in FIG. 12, in the first embodiment, the page group 43 including the data parts 411A, 411B, 411C storing data of the same contents are stored in two pages; namely, the page 44 including the data part 441 and the page 45 including the code part 451. In this embodiment, data "Data 0 to Data n−1" of the page 44 is further compressed and converted into compressed data (Comp Data) 72.

Here, the compressed data is configured, for example, from format data. As described above, upon using a storage device, format data of a specific pattern is written in the entire area of the storage device for the purpose of detecting an abnormal location of the storage device or writing a guarantee code in advance. Nevertheless, the writing of format data entailed a problem in that the rewrite count is needlessly increased in a storage device such as a flash memory in which rewriting is limited.

Thus, in this embodiment, since insubstantial data such as "0" is normally written as the format data, de-duplication of dividing the page group 43 in which "0" is written in the data parts 411A, 411B and 411C into the pages 44 and 45 is executed. In addition, the data parts written with format data such as "0" are compressed and consolidated in the page 71.

Moreover, as shown in FIG. 12, the guarantee codes "C 0 to C n−1" are stored in the unused area of the page 71 storing the compressed data 72. The two pages of page 44 and page 45 are consolidated in a single page of page 71. Note that all of page 71 may be used for storing the compressed data 72 and the guarantee code 73, or management information such as management tables may be stored in the unused area (reserve).

Figure 13:
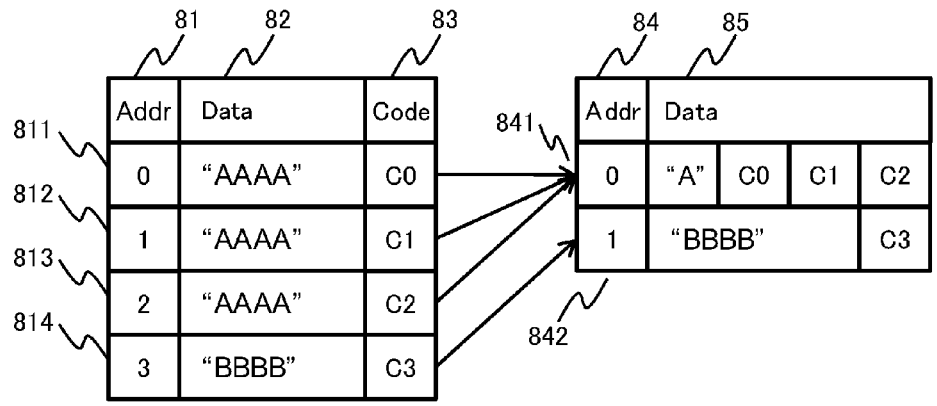
FIG. 13A is a conceptual diagram explaining the logical/physical page address according to the same embodiment.
FIG. 13B is a chart showing an example of the logical/physical address conversion table according to the same embodiment.
FIG. 13C is a chart showing an example of the dereference table according to the same embodiment.

A specific example of de-duplication in this embodiment is now explained. FIG. 13A shows the correspondence relation of a logical page address and a physical page address. As shown in FIG. 13A, Addr 81 shows the logical page address, and Data 82 shows the data stored in the logical page address space. Moreover, Code 83 shows the guarantee code that is stored in the logical page address space. Addr 84 shows the physical page address associated with the logical page, and Data 85 shows the contents of data stored in the physical page address space.

The data 52, which is stored in the logical pages 811 to 813 shown as logical page addresses 0 to 2, stores data "AAAA" of the same contents. In the foregoing case, the respective logical page addresses 0 to 2 of the logical pages 811 to 813 are associated with the physical page address 0 of the physical page 841. The physical page 841 stores the data "A" as compressed data "AAAA", and stores the guarantee codes C0 to C2 corresponding to the logical pages 811 to 813 to become the reference source. Meanwhile, the logical page 814 that has not been de-duplicated is associated with the physical page 842, and the physical page 842 stores, as per usual, the data and the guarantee code.

The management table for realizing the foregoing association of the logical page and the physical page is now explained. The logical/physical address conversion table 86 is a table for managing the association of the logical address and the physical address and is configured, as shown in FIG. 13B, from a logical page address column 861, a physical page address column 862 and a flag column 863.

The logical page address column 861 stores the top address of the logical pages. The physical page address column 862 stores the top address of the physical pages associated with the logical page address column 861. The flag column 863 stores a flag for determining whether the corresponding logical page has been de-duplicated.

For example, if "1" is stored in the flag column 863, it is determined that the corresponding logical page is a de-duplicated page, and the compressed data is de-compressed or the location of the guarantee code in the physical page is calculated. The location of the guarantee code in the physical page is calculated from, for example, the offset location from the logical page address to become the reference source. As a result of setting a flag for determining whether the logical page address corresponding to the flag column 863 has been compressed, it is no longer necessary to retain the actual location of the physical page storing the guarantee code.

In addition, it is also possible to set a flag for determining whether de-duplication has been performed in units of an arbitrary number of a plurality of logical pages, rather than in logical page units, in order to reduce the amount of data to be stored in the physical page. For example, in the case of data such as format data in which the arrangement of the addresses of the logical page group to be de-duplicated is in sequence and, after the compression of data, it is guaranteed that the data will be within a given size, let it be assumed that the number of logical pages in the de-duplicated physical pages will be decided in advance and in a fixed manner. In the foregoing case, as a result of setting a flag for determining whether de-duplication was performed in units of a plurality of logical pages, the table size of the logical/physical address conversion table 86 can be reduced. However, in the foregoing case, since a flag for performing de-duplication for each logical page within the arbitrary range, if a logical volume other than the one logical volume has been de-duplicated among the logical pages within a specific range, separate information will be required for the logical page that has not been de-duplicated.

Moreover, the dereference table 87 is a table for managing which logical page is referring to the physical page and is configured, as shown in FIG. 13C, from a physical page address column 871, a reference count column 872 and a logical page representative address column 873.

The physical page address column 871 stores the top address of the physical pages storing the data and guarantee code. The reference count column 872 stores the number of logical pages referring to the data stored in the physical pages. The logical page representative address column 872 stores the representative address of the logical pages of the reference source. The representative address of the logical pages is the address of the top logical page among a plurality of logical pages that were de-duplicated. Specifically, the location of the guarantee code of an arbitrary logical page that is pointing to the relevant physical page can be obtained from the offset from the representative address of the logical pages.

Moreover, rather than storing information corresponding to the respective physical pages in the dereference table 87, the amount of information to be stored in the dereference table 87 can be reduced by storing information corresponding to units of an arbitrary number of physical page. For example, the reference count can be collectively managed in physical block units to become the erase units. In the foregoing case, by converting the logical address and the physical address based on the reference count of erase units and the representative address of the logical pages of the reference source and confirming the logical pages of the reference source, the reference count for each physical page unit can be restored.

(2-3) Detailed Operation of Storage Apparatus (2-3-1) De-Duplication Processing

Figure 14:
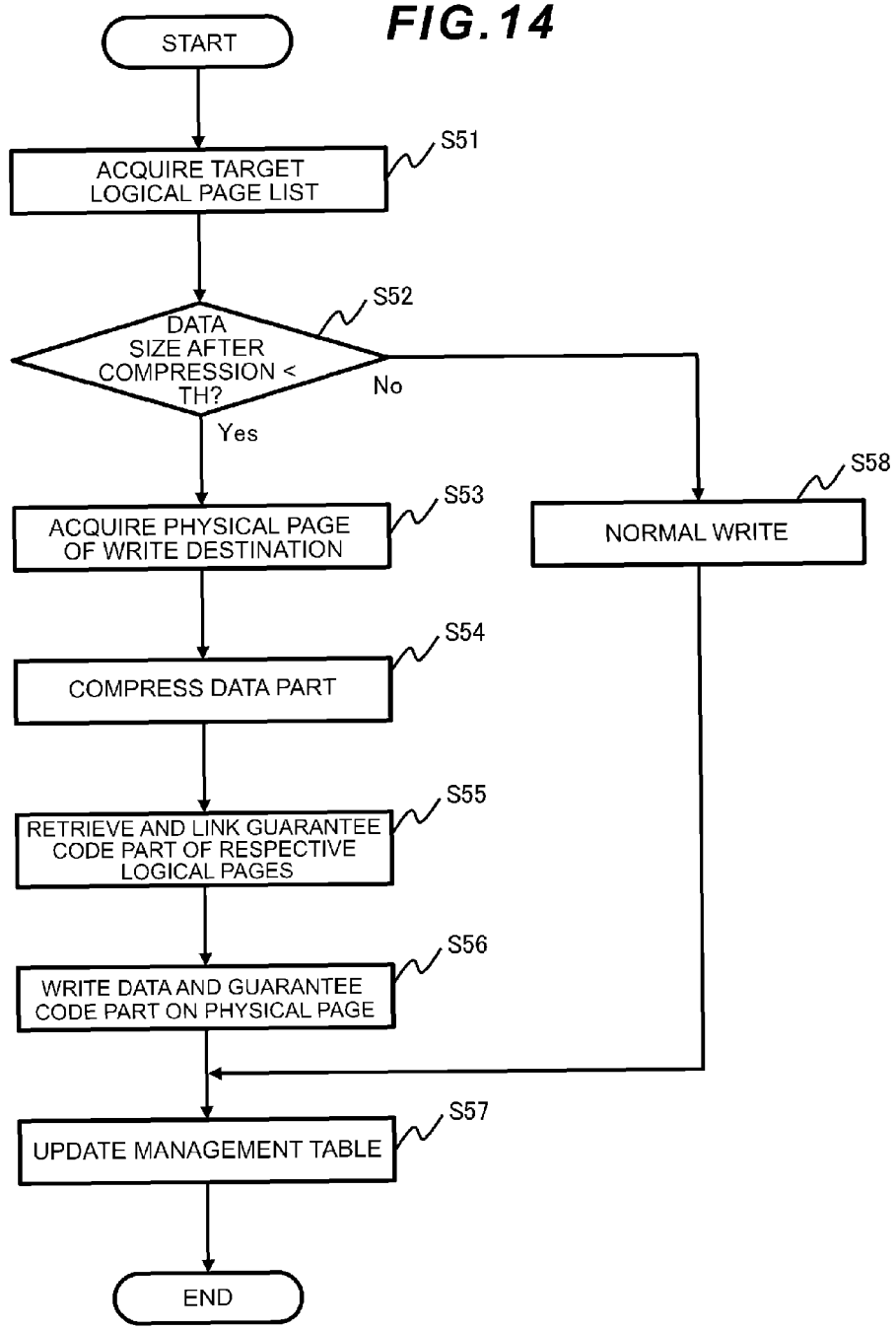
FIG. 14 is a flowchart showing the flow of the de-duplication processing according to the same embodiment.

The de-duplication processing in the storage apparatus 11 according to this embodiment is now explained. In the ensuing explanation, the processing that is different from the first embodiment is explained in detail, and the explanation regarding the same configuration as the first embodiment is omitted. As shown in FIG. 14, the controller 213 foremost acquires the logical page list to be de-duplicated (S51). A logical page list is configured from at least three or more pages in which the contents of the data part stored in the user data in the page are the same, and the contents of the code part stored in the guarantee code are different.

Subsequently, the controller 213 determines whether the data size after compression of the data parts of a plurality of logical pages included in the logical page list acquired at step S51 is smaller than a predetermined threshold TH (S52). If it is determined at step S52 that the data size after compression is greater than a predetermined threshold TH, the controller 213 executes normal write processing without performing the de-duplication processing (S58). If it is determined at step S52 that the data size after compression is smaller than a predetermined threshold TH, the controller 213 executes the de-duplication processing of step S53 onward.

Here, the threshold TH is set in advance in the management program or the like, and is a value that is set so that, when the data size is smaller than the threshold TH, the value obtained by totaling the size of the data parts after compression of the logical pages to be de-duplicated and the size of the code parts will be within the size of one physical page.

If it is determined at step S52 that the data size after compression is smaller than the threshold TH, the controller 231 acquires the physical page storing the data parts of the logical pages acquired at step S51 (S53). Note that, in the foregoing explanation, since the restriction of the threshold TH causes a fixed number of logical pages to be compiled in one physical page, normal Write is performed if the data size is greater than the threshold TH. Nevertheless, if a fixed number of logical pages do not fit in one physical page, the restriction of the threshold TH may be canceled and the logical pages may be stored by being divided into a plurality of physical pages.

The controller 231 thereafter compresses the data parts of the logical pages to be de-duplicated (S54). Then the controller 231 extracts and links the code parts of the respective logical pages to be de-duplicated (S55). Subsequently, the controller 231 links the data parts that were compressed at step S54 and the code parts that were linked at step S55, and writes this in the physical page acquired at step S53 (S56).

The controller 231 thereafter updates the logical/physical address conversion table 56 and the dereference table 57, which are management tables (S57). Specifically, the controller 231 updates the value of the physical page address column 862 to the value of the physical page address of the data storage destination regarding the entries corresponding to the logical pages to be de-duplicated in the logical/physical address conversion table 86, and stores "1" in the de-duplication flag column 863.

Moreover, the controller 231 updates the entries corresponding to the physical page associated with the logical page to be de-duplicated in the dereference table 87. Specifically, the controller 231 stores "1" in the reference count column 872 of the dereference table 87, and additionally stores the representative address of the target logical pages in the logical page representative address 873.

(2-3-2) Reclamation Processing and Refresh Processing

Figure 15:
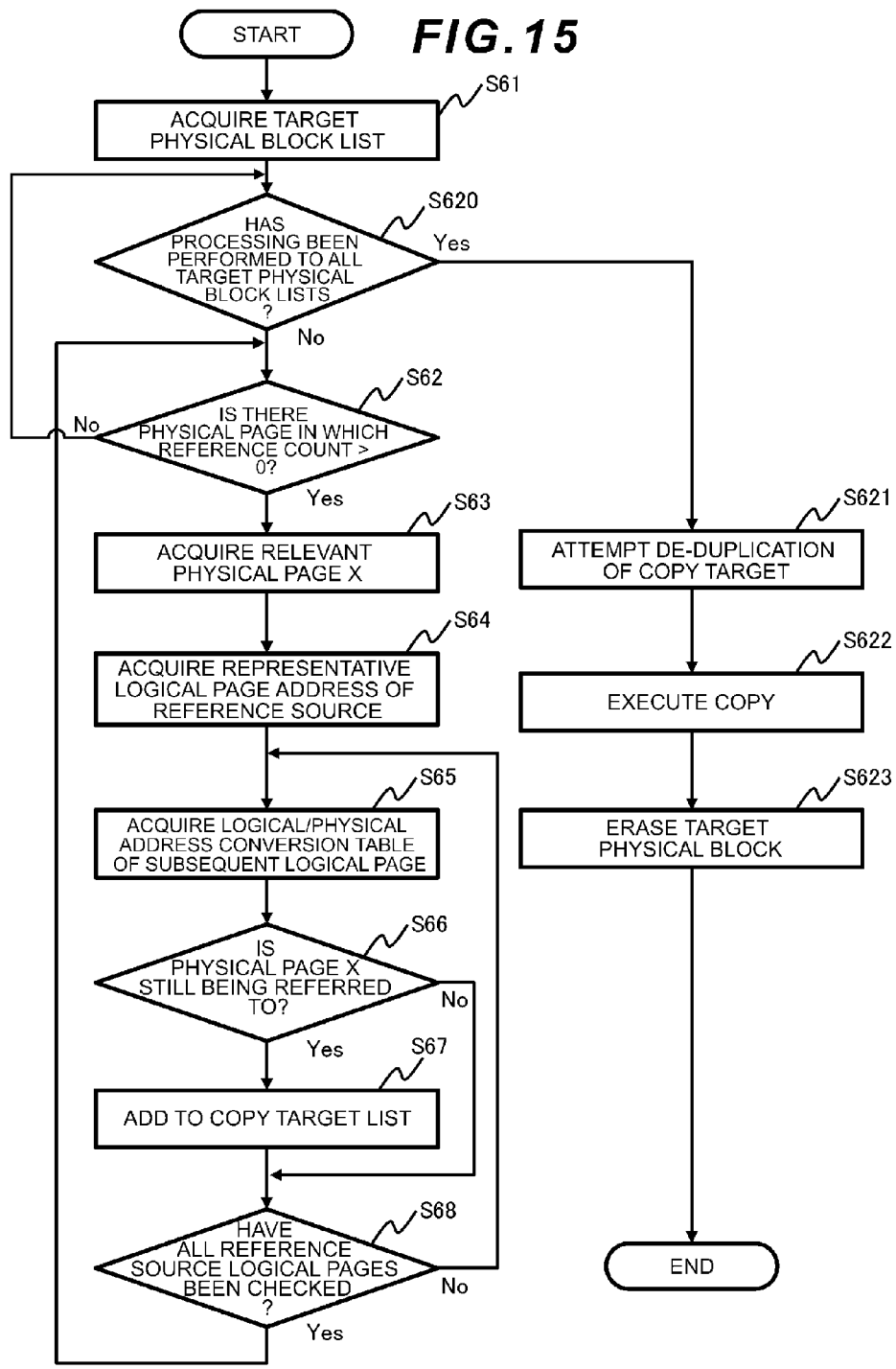
FIG. 15 is a flowchart showing the flow of the reclamation processing and refresh processing according to the same embodiment.

Since the reclamation processing and refresh processing according to this embodiment are basically the same as the reclamation processing and the refresh processing according to the first embodiment, the different points are explained in detail. This embodiment differs from the first embodiment in that, as shown in FIG. 15, the controller 231 acquires a representative address of the logical pages referring to the physical page X (S64) after acquiring the physical page X to be processed at step S63.

In order to check the current referral destination of the logical pages which could be referring to the physical page X as the starting point of the representative address of the logical pages acquired at step S64, the controller 231 acquires the entry of the logical/physical address conversion table 86 of the subsequent logical page of the representative address of the logical page (S65). The controller 231 thereafter checks whether the logical pages acquired at step S65 are still referring to the physical page X (S66), and adds the relevant logical pages to the copy target list if they are still referring to the physical page X (S67).

(2-3-3) Read Processing

Figure 16:
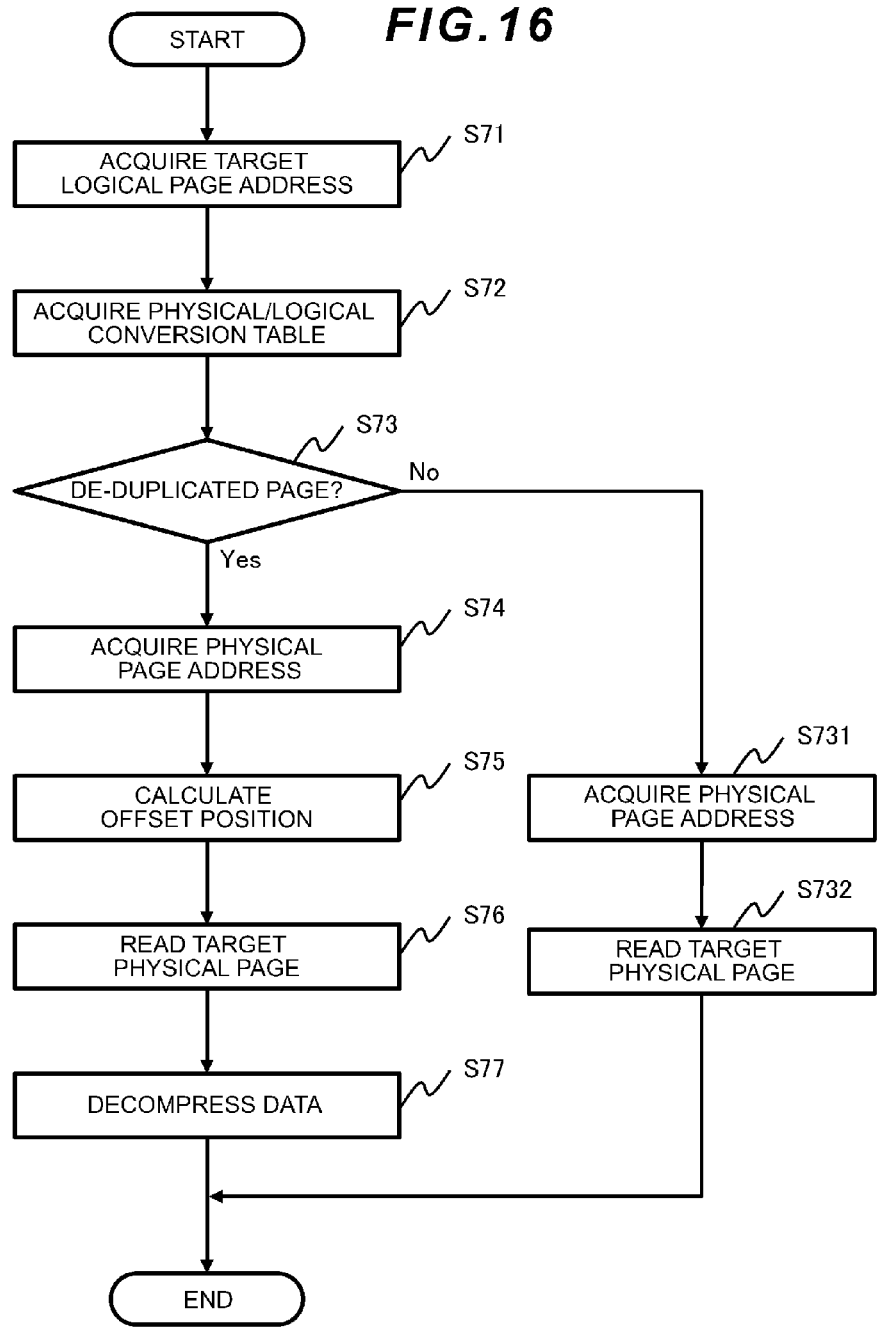
FIG. 16 is a flowchart showing the read processing according to the same embodiment.

Also with respect to the read processing according to this embodiment, the points that are different from the read processing according to the first embodiment are explained in detail. As shown in FIG. 16, the controller 231 acquires a logical page address to be read (S71).

Subsequently, the controller 231 acquires the target logical/physical address information from the logical/physical address conversion table 86 (S72). The controller 231 thereafter determines whether the logical page acquired at step S71 is a page that was subject to de-duplication processing (S73).

If it is determined at step S73 that the logical page is a de-duplicated page, the controller 231 executes the processing of step S74 onward. Meanwhile, if it is determined at step S73 that the logical page is a page that has not been de-duplicated, the controller 231 executes the processing of step S731.

When it is determined that the logical page is a de-duplicated page, the controller 231 acquires the physical page data address storing the data parts of the logical page (S74). The controller 231 thereafter calculates the offset location of the guarantee code in the physical page from the logical page representative address of the reference source (S75). Then, the controller 231 reads the data stored in the physical page address associated with the logical page to be read (S76). In addition, the controller 231 decompresses the data that was acquired at step S76 (S77).

Meanwhile, if it is determined at step S73 that the logical page is a page that has not been de-duplicated, the controller 231 acquires the physical page address storing the data part and guarantee code part corresponding to the logical page (S731). The controller 231 thereafter reads the physical page that is stored in the physical page address acquired at step S731 (S732).

Moreover, if it is determined at step S73 that the logical page is a normal page that has not been de-duplicated, the controller 231 acquires the address of the physical page corresponding to the logical page (S731). Specifically, the controller 231 acquires the physical page data address stored in the physical page data address column 562 of the logical/physical address conversion table 56.

Subsequently, the controller 231 reads the data stored in the physical page based on the physical page address associated with the logical page to be read (S732).

(2-4) Effect of this Embodiment

As described above, with the computer system 2 according to this embodiment, the data part to be de-duplicated is compressed in addition to performing the de-duplication processing. It is thereby possible to perform de-duplication even to data assigned with a guarantee code and further compress the data part, and prolong the life of the flash memory as a result of reducing the amount of data that is written in the storage medium. In addition, in a storage medium such as a flash memory adopting the recordable writing method, it is possible to improve the performance stability by increasing the unused area that is not being used by the user and using such unused area as an area for recording data.

(3) Third Embodiment (3-1) Hardware Configuration of Computer System

The hardware configuration of the computer system 3 according to this embodiment differs in that the flash memory storage 17 of the computer system 1 according to the first embodiment is configured as a device that is separate from the storage apparatus 11. This embodiment is common with the first embodiment in that a plurality of logical pages are subject to de-duplication, but differs in that the storage apparatus 11 and the flash memory storage 17 jointly execute the de-duplication. Specifically, the data traffic is reduced by the storage apparatus 11 sending a specific pattern rather than sending actual data to the flash memory storage 17 regarding the format data and the like to be written into a storage area according to a request from the host 12.

(3-2) Detailed Operation of Computer System

The de-duplication processing that is executed between the storage apparatus 11 and the flash memory storage 17 is now explained.

Figure 17:
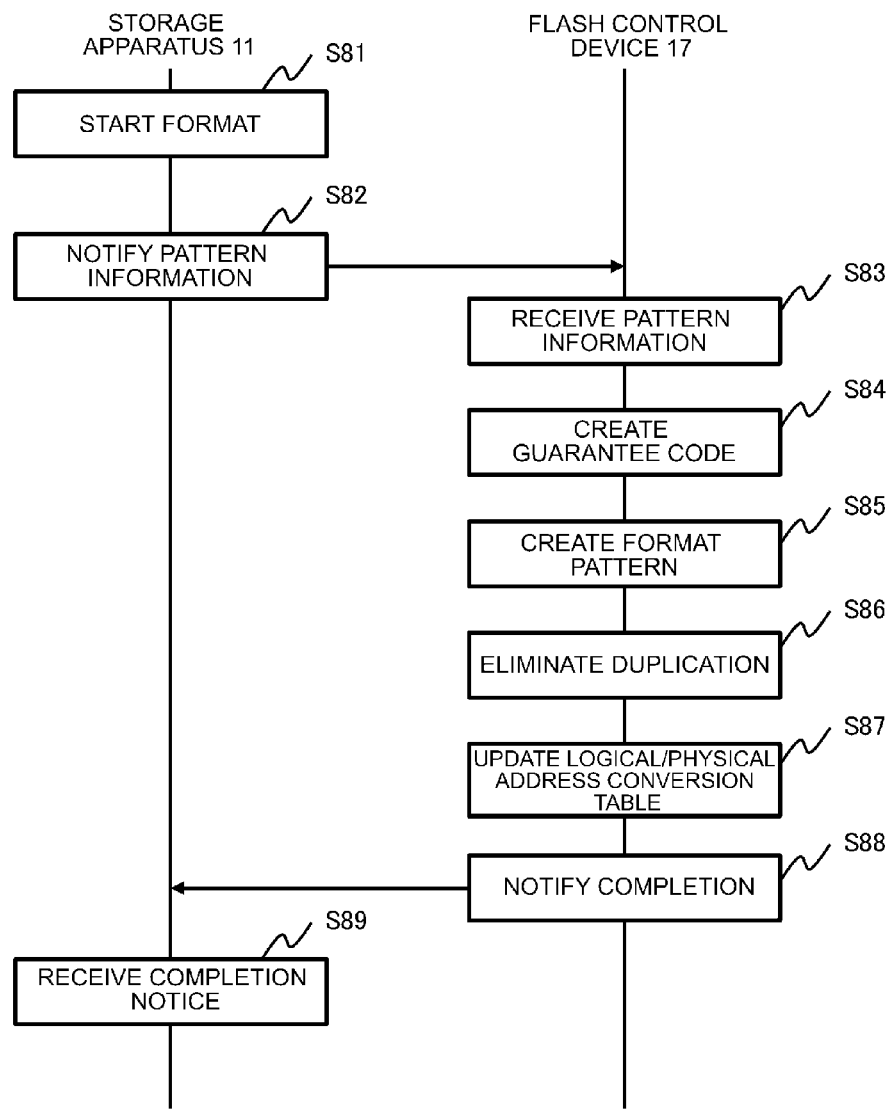
FIG. 17 is a timing chart showing the flow of the de-duplication processing according to the third embodiment of the present invention.

As shown in FIG. 17, the storage apparatus 11 foremost starts formatting the storage area according to a request from the host 12 (S81). The storage apparatus 11 formats the storage area by writing a specific pattern for each sector in the entire target storage area. The storage apparatus 11 also assigns a guarantee code upon writing the specific pattern.

The storage apparatus 11 sends, to the controller 213, pattern information such as the format pattern created according to the request from the host 12 and a creation rule of the guarantee code to be assigned to the format data (S82). Here, the pattern information is, for example, a fixed pattern such as all 0, and the guarantee code is, for example, a code in the format assigned with logical address information in addition to an error correction code that is created from the data part. Specifically, the storage apparatus 11 does not actually write the format information in the storage area, but rather notifies the pattern information including the format pattern and the creation rule of the guarantee code. It is thereby possible to reduce the data traffic.

Subsequently, the flash memory storage 17 receives the pattern information sent from the storage apparatus 11 at step S82 (S83). The flash memory storage 17 thereafter creates a guarantee code of the respective logical pages corresponding to the storage area to be formatted based on the pattern information sent from the storage apparatus 11 (S84). Then, the flash memory storage 17 creates a format pattern based on the pattern information (S85).

Subsequently, the flash memory storage 17 executes the de-duplication processing to the logical page created at step S85 (S86). Since the de-duplication processing at step S86 is the same processing as in the first embodiment, the detailed explanation thereof is omitted.

The flash memory storage 17 thereafter updates the target entry of the logical/physical address conversion management table 56 regarding the de-duplicated logical table (S87). Since the update processing of the logical/physical address conversion management table 56 at step S87 is the same as the processing in the first embodiment, the detailed explanation thereof is omitted.

Subsequently, the flash memory storage 17 notifies the completion of the format processing to the storage apparatus 11 (S88). The storage apparatus 11 receives the format processing completion notice from the flash memory storage 17, and notifies the host 12 that the format processing is complete.

(3-3) Effect of this Embodiment

According to the computer system 3 according to this embodiment, the data and the guarantee code are written into the storage area based on specific pattern information. It is thereby possible to reduce the data traffic in the writing of data. Furthermore, it is possible to perform de-duplication even to data assigned with a guarantee code, and prolong the life of the flash memory as a result of reducing the amount of data that is written in the storage medium. In addition, in a storage medium such as a flash memory adopting the recordable writing method, it is possible to improve the performance stability by increasing the unused area that is not being used by the user and using such unused area as an area for recording data.

(4) Other Embodiments

Although the foregoing embodiments execute the de-duplication processing and the like based on various programs stored in the flash control device 210, the present invention is not limited to the foregoing example, and, for example, the flash control device 210 may be provided to an apparatus that is separate from the storage apparatus 11 and cooperate with the flash control device 210 to realize the various functions. Moreover, the various functions can also be realized by providing the various programs stored in the flash control device 210 in an apparatus that is separate from the storage apparatus 11, and such programs being called by the flash control device 210.

INDUSTRIAL APPLICABILITY

The present invention can be applied to storage apparatuses capable of improving the data capacity efficiency by de-duplicating data assigned with a guarantee code that is different for each data.

REFERENCE SIGNS LIST

11 Storage apparatus
112 Host interface
113 Storage interface
114 Maintenance interface
115 CPU
116 Memory
12 Host
13 Management terminal
14 SAN
16 Connector
17 Flash memory storage apparatus
21 Flash memory module
210 Flash control device
211 Storage interface
212 CPU
213 Controller
213 Memory
215 Buffer
216 Flash memory interface
31 Flash memory chip

What is claimed is:

1. A flash memory module, comprising:
a plurality of flash memory chips, each flash memory chip including a plurality of blocks, each block including a plurality of physical pages, wherein each physical page is a unit for writing/reading data; and
a memory controller configured to manage:
a first data set and a first guarantee code set, wherein:
the first data set includes a plurality of first user data,
the first guarantee code set includes a plurality of first guarantee codes, and
each of the plurality of first guarantee codes is associated with one of the plurality of first user data, and
a second data set and a second guarantee code set, wherein:
the second data set includes a plurality of second user data,
the second guarantee code set includes a plurality of second guarantee codes, and
each of the plurality of second guarantee codes is associated with one of the plurality of second user data, and
wherein if the first data set and the second data set are a same data set, the memory controller is further configured to:
store the same data set into a first physical page, and
store both the first guarantee code set and the second guarantee code set into a second physical page.

2. The flash memory module according to claim 1, wherein each of the plurality of first guarantee codes and each of the plurality of second guarantee codes includes:
a bit error correction code part calculated from the user data associated with the guarantee code; and
a target data address part, which is an address of the user data associated with the guarantee code.

3. The flash memory module according to claim 1, wherein each of the plurality of first guarantee codes and each of the plurality of second guarantee codes are different.

4. The flash memory module according to claim 1, wherein a location of each of the plurality of first guarantee codes and each of the plurality of second guarantee codes in the second physical page is stored as an offset value relative to a top address of the second physical page.

5. The flash memory module according to claim 4, wherein the offset value is stored in a logical/physical address conversion table.

6. The flash memory module according to claim 1, wherein the first physical page and the second physical page are located in different blocks.

7. The flash memory module according to claim 1, wherein the memory controller is further configured to perform read processing, including:

acquiring a logical page address to be read;
acquiring target logical/physical address information from a logical/physical address conversion table;
determining whether the acquired logical page was subject to de-duplication processing;
if the acquired logical page was not subject to de-duplication processing, then acquiring a physical page address corresponding to the logical page;
if the acquired logical page was subject to de-duplication processing, then:
   acquiring a physical page data address where a data part of the logical page is stored;
   acquiring a physical page code address where guarantee codes of the logical page are stored; and
   acquiring a physical page code offset address to identify a physical location of the guarantee codes within the physical page; and
reading data stored in a physical page based on the physical page address.

8. The flash memory module according to claim 1, wherein if there is an unused area in a physical page storing the first guarantee code set or the second guarantee code set, the memory controller is further configured to:
   merge the first guarantee code set and the second guarantee code set into a single physical page by copying the first guarantee code set and the second guarantee code set to a new physical page and releasing the physical pages where the first guarantee code set and the second guarantee code set were previously stored.

9. A storage apparatus, comprising:
a storage controller; and
a plurality of flash memory modules, each of the plurality of flash memory modules including:
   a plurality of flash memory chips, each flash memory chip including a plurality of blocks, each block including a plurality of physical pages, wherein each physical page is a unit for writing/reading data; and
   a memory controller configured to manage:
      a first data set and a first guarantee code set, wherein:
         the first data set includes a plurality of first user data,
         the first guarantee code set includes a plurality of first guarantee codes, and
         each of the plurality of first guarantee codes is associated with one of the plurality of first user data, and
      a second data set and a second guarantee code set, wherein:
         the second data set includes a plurality of second user data,
         the second guarantee code set includes a plurality of second guarantee codes, and
         each of the plurality of second guarantee codes is associated with one of the plurality of second user data, and
      wherein if the first data set and the second data set are a same data set, the memory controller is further configured to:
         store the same data set into a first physical page, and
         store both the first guarantee code set and the second guarantee code set into a second physical page.

10. The storage apparatus according to claim 9, wherein each of the plurality of first guarantee codes and each of the plurality of second guarantee codes includes:
   a bit error correction code part calculated from the user data associated with the guarantee code; and
   a target data address part, which is an address of the user data associated with the guarantee code.

11. The storage apparatus according to claim 9, wherein each of the plurality of first guarantee codes and each of the plurality of second guarantee codes are different.

12. The storage apparatus according to claim 9, wherein a location of each of the plurality of first guarantee codes and each of the plurality of second guarantee codes in the second physical page is stored as an offset value relative to a top address of the second physical page.

13. The storage apparatus according to claim 12, wherein the offset value is stored in a logical/physical address conversion table.

14. The storage apparatus according to claim 9, wherein the first physical page and the second physical page are located in different blocks.

15. The storage apparatus according to claim 9, wherein the memory controller is further configured to perform read processing, including:
   acquiring a logical page address to be read;
   acquiring target logical/physical address information from a logical/physical address conversion table;
   determining whether the acquired logical page was subject to de-duplication processing;
   if the acquired logical page was not subject to de-duplication processing, then acquiring a physical page address corresponding to the logical page;
   if the acquired logical page was subject to de-duplication processing, then:
      acquiring a physical page data address where a data part of the logical page is stored;
      acquiring a physical page code address where guarantee codes of the logical page are stored; and
      acquiring a physical page code offset address to identify a physical location of the guarantee codes within the physical page; and
   reading data stored in a physical page based on the physical page address.

16. The storage apparatus according to claim 9, wherein if there is an unused area in a physical page storing the first guarantee code set or the second guarantee code set, the memory controller is further configured to:
   merge the first guarantee code set and the second guarantee code set into a single physical page by copying the first guarantee code set and the second guarantee code set to a new physical page and releasing the physical pages where the first guarantee code set and the second guarantee code set were previously stored.

* * * * *